US010424468B2

(12) United States Patent
De Bosscher et al.

(10) Patent No.: US 10,424,468 B2
(45) Date of Patent: Sep. 24, 2019

(54) SPUTTER DEVICE WITH MOVING TARGET

(71) Applicant: SOLERAS ADVANCED COATINGS BVBA, Deinze (BE)

(72) Inventors: Wilmert De Bosscher, Drongen (BE); Ivan Van De Putte, Waregem (BE)

(73) Assignee: SOLERAS ADVANCED COATINGS BVBA, Deinze (BE)

( * ) Notice: Subject to any disclaimer, the term of this patent is extended or adjusted under 35 U.S.C. 154(b) by 0 days.

(21) Appl. No.: 15/324,853

(22) PCT Filed: Jul. 8, 2015

(86) PCT No.: PCT/EP2015/065645
§ 371 (c)(1),
(2) Date: Jan. 9, 2017

(87) PCT Pub. No.: WO2016/005476
PCT Pub. Date: Jan. 14, 2016

(65) Prior Publication Data
US 2017/0207071 A1    Jul. 20, 2017

(30) Foreign Application Priority Data

Jul. 9, 2014   (EP) .................................... 14176303
Apr. 30, 2015  (EP) .................................... 15166011

(51) Int. Cl.
C23C 14/34    (2006.01)
H01J 37/34    (2006.01)
(Continued)

(52) U.S. Cl.
CPC ............ *H01J 37/347* (2013.01); *C23C 14/34* (2013.01); *C23C 14/3407* (2013.01);
(Continued)

(58) Field of Classification Search
CPC ..................................................... H01J 37/342
See application file for complete search history.

(56) References Cited

U.S. PATENT DOCUMENTS 6,365,010 B1    4/2002  Hollars
6,488,824 B1   12/2002  Hollars et al.
(Continued)

FOREIGN PATENT DOCUMENTS

CN    1896299 A    1/2007
CN  101681844 A    3/2010
(Continued)

OTHER PUBLICATIONS

Extended European Search Report for corresponding European Application No. 14176303.7, dated Jan. 14, 2015.
(Continued)

*Primary Examiner* — Jason Berman
(74) *Attorney, Agent, or Firm* — Workman Nydegger

(57) ABSTRACT

A sputter device for depositing a layer on a substrate in a vacuum chamber and having a layer property in each point of the substrate surface. The sputter device comprises at least one end block adapted for holding a cylindrical target having a longitudinal axis in a first direction, and a first drive means for providing a rotational movement of the at least one cylindrical target around its longitudinal axis. The sputter device includes a second drive means for applying a translational movement to an end block in a second direction. The first and the second drive means are adapted for, during sputtering, being simultaneously operational in the vacuum chamber. The movement of the first drive means does not impact the uniformity of the layer sputtered on the substrate in the direction on the surface of the substrate corresponding to a perpendicular projection of the second direction onto the substrate.

19 Claims, 10 Drawing Sheets

(51) Int. Cl.
*C23C 14/56* (2006.01)
*C23C 14/54* (2006.01)

(52) U.S. Cl.
CPC .......... *C23C 14/542* (2013.01); *C23C 14/562* (2013.01); *H01J 37/342* (2013.01); *H01J 37/345* (2013.01); *H01J 37/3414* (2013.01); *H01J 37/3417* (2013.01); *H01J 37/3435* (2013.01)

(56) References Cited

U.S. PATENT DOCUMENTS

| | | | |
|---|---|---|---|
| 7,563,725 | B2 | 7/2009 | Morad |
| 8,580,037 | B2 | 11/2013 | Morad |
| 2006/0000705 | A1* | 1/2006 | Hartig ................. H01J 37/3405 204/192.12 |
| 2008/0248647 | A1* | 10/2008 | Morad .................... C30B 23/02 438/679 |
| 2009/0255471 | A1 | 10/2009 | Morad |
| 2010/0051445 | A1 | 3/2010 | Vetter et al. |
| 2011/0079508 | A1 | 4/2011 | Bender et al. |
| 2012/0080309 | A1 | 4/2012 | Bender et al. |
| 2012/0273343 | A1 | 11/2012 | Bender et al. |
| 2013/0228452 | A1 | 9/2013 | De Bosscher |
| 2013/0284590 | A1 | 10/2013 | Bender et al. |

FOREIGN PATENT DOCUMENTS

| | | |
|---|---|---|
| CN | 102549706 A | 7/2012 |
| CN | 102934197 A | 2/2013 |
| FR | 2940321 A1 | 6/2010 |
| JP | 2002529600 A | 9/2002 |
| JP | 2003183823 A | 7/2003 |
| JP | 2012132039 A | 7/2012 |
| JP | 2013001920 A | 1/2013 |
| JP | 2013544958 A | 12/2013 |
| JP | 2014074188 A | 4/2014 |

OTHER PUBLICATIONS

International Preliminary Report on Patentability for corresponding International PCT Application No. PCT/EP2015/065645, dated Jul. 8, 2016.
International Search Report for corresponding International PCT Application No. PCT/EP2015/065645, dated Dec. 9, 2015.
Japanese Office Action from JP Application No. 2017-500328, dated Oct. 31, 2018.
Chinese Office Action from CN Application No. 201580037325.X, dated Aug. 3, 2018.

* cited by examiner

SPUTTER DEVICE WITH MOVING TARGET

FIELD OF THE INVENTION

The present invention relates to the field of sputter devices. More specifically it relates to sputter devices for being used in sputter systems for coating large area surfaces, containing large area substrates or an array of smaller substrates together forming a large area surface.

BACKGROUND OF THE INVENTION

When sputtering 2-dimensional surfaces, for instance for fabricating displays (e.g. TFT displays) or electronic devices, typically multiple layers are deposited, at least some of them comprising different materials.

In order to obtain this, in prior art solutions the substrate is physically moved from one sputter chamber where one or more layers of a first material are deposited onto the substrate, to another sputter chamber where one or more layers of a different material are sputtered onto the same substrate.

Within one sputter chamber the substrate is typically being held substantially static during sputtering, although this is not required. The substantially static configuration has the advantage that fewer contaminating or defect generating particles are introduced in the coating, but it requires a plurality of targets or a large single target for which the two dimensional size of the sputter device holding these plurality of targets or this large single target is similar to or larger than the two dimensional size of the substrate. Contaminating or defect generating particles in the sputtered coating generate defects in the structure of the sputtered coating and are therefore to be avoided. It is known that moving the substrate while sputtering increases the concentration of contaminating particles in the substrate. Typically the size of the contaminating particles is between 10 and 30 μm.

An issue occurring in cluster coaters for sputtering large area surfaces is the uniformity of the resulting coating. Typically the spread in thickness of the coating over the area of the substrate is around 10% or even more of the thickness of the coating.

In view of the above requirements there is still room for improvements in sputtering systems for sputtering large area surfaces.

SUMMARY OF THE INVENTION

It is an object of embodiments of the present invention to provide a good sputter system, in particular a good sputter system for sputtering large area surfaces. A large area surface may be a single large area substrate or it may comprise an array of smaller substrates which together form a large area surface, and which are provided for being coated together. The latter may for instance be useful if the substrate, once coated, would not be suitable anymore for being cut into smaller substrates, while such smaller substrates are what is needed in an end product. A large area surface, and hence also a large area substrate, may be defined as being at least 300 mm×400 mm, for instance 1100 mm–1300 mm, 1500 mm–1800 mm and currently up to 2900 mm–3200 mm.

The above objective is accomplished by a method and device according to embodiments of the present invention.

In a first aspect, the present invention provides a sputter device for depositing a layer on a substrate in a vacuum chamber, the layer having a length in a length direction and a width in a width direction, the length direction and the width direction not being parallel. The length direction and the width direction may be orthogonal to one another. For a substrate which is moving within the sputter chamber during the sputter process, the length direction may typically be the direction of transportation. For a static substrate, which does not substantially move within the sputter chamber during the sputter process, the length direction is the direction along which a target moves so as to coat substantially the complete substrate surface with target material. The finally deposited layer has, at any point of the substrate, a layer property, such as for instance, but not limited thereto, thickness. The sputter device comprises:

at least one end block adapted for each holding a cylindrical target having a longitudinal axis in a first direction. The cylindrical target is intended for spatial particle ejection distribution in an average ejection direction. The longitudinal axis may be substantially covering the width of the substrate.

a first drive means for providing rotational movement of the at least one cylindrical target around its longitudinal axis, a second drive means for applying a translational movement to the at least one end block in a second direction, thereby keeping the target axis parallel during at least a significant portion of the movement trajectory along the second direction. The first and the second drive means are adapted for, during sputtering, being operational simultaneously in the vacuum chamber.

The movement by the second drive means may be driven such that the layer property of the deposited layer on the substrate along a curve on the substrate, defined by a projection of a sputter location of the target onto the substrate under a relative movement between target and substrate, deviates less than a predetermined layer property deviation margin. In particular embodiments of the present invention, where either the target moves in the second direction along the length direction of the substrate, or the substrate itself moves along the length direction, the above-mentioned curve corresponds to a perpendicular projection of the second direction onto the substrate. In such case, the layer property along a substantial portion in the length direction of that projection deviates less than a predetermined layer property deviation margin. With "a substantial portion in the length direction" is meant at least 80% of the length direction, for instance at least 90% of the length direction, such as at least 95% of the length direction, or even the complete length direction. The layer property deviation margin determines the degree of uniformity of the sputtered layer.

By the second drive means, the at least one end block is moved along a movement trajectory which may take on any shape in 3D. This 3D movement capability of the at least one end block, driven by the second drive means, provides a practical solution to coating a larger width substrate with a smaller sized target, for instance by having several passes along the substrate length with the target being positioned at several positions of the substrate width. In such embodiments, the movement of the at least one end block driven by the second drive means, may for instance be repetition of a sequence of a movement in the width direction of the substrate, to position the target at a particular width position of the substrate, followed by a movement along the second direction (e.g. along the length direction of the substrate, or transversal to the substrate or to the substrate movement direction).

In particular embodiments, the movement trajectory lies preferentially in a plane, although the invention is not limited thereto. In practical embodiments, it is most likely that the movement trajectory will lie in a horizontal plane, although the present invention is not limited thereto, The length direction may be defined as a direction along a dimension of the substrate, defined by an intersection of an intersection plane parallel to the movement plane containing a portion of (as defined by) the movement applied by the second drive means. In particular embodiments, the movement trajectory imposed by the second drive means may have a component along the first direction, for instance may be in the first direction.

In typical embodiments, the target may be placed vertically upstanding, and also the substrate may be placed vertically upstanding. In embodiments of the present invention, the width direction of the substrate may then correspond to the vertical direction. In such embodiments, if the second drive means applies a movement to the at least one end block in a horizontal plane, the length direction of the substrate is a horizontal line on the substrate, defined by the intersection between the substrate and a horizontal intersection plane, parallel to the movement plane defined by the movement of the at least one end block, applied by the second drive means. In alternative embodiments, still with the substrate vertically upstanding, the target may be placed in a horizontal position, and the second drive means may apply a movement to the at least one end block in a vertical plane. In such case, the width direction of the substrate corresponds to the horizontal direction, and the length direction of the substrate corresponds to the vertical direction.

In alternative embodiments, the target may be placed under an angle, deviating from the vertically upstanding or horizontal position. Even in such positions, the movement trajectory may lie, for instance, in a horizontal or a vertical plane, respectively, and the length direction may be defined along a horizontal or a vertical line, respectively, on the substrate.

The second direction may be, but does not need to be, oriented perpendicular to the first direction. The first direction may be, but does not need to be, vertical.

It is an advantage of embodiments of the present invention that efficient methods and systems for sputtering a uniform coating on large area surfaces, for instance large area substrates or arrays of smaller substrates, are provided. With a uniform coating is meant a coating which has a uniform distribution of the layer property, for instance thickness, or an optical or electrical characteristic. Hence, the applied coating has a layer property which deviates less than a predetermined layer property deviation margin, on the substrate, along a substantial portion in the length direction. The layer property deviation margin determines the degree of uniformity of the sputtered layer, and may for instance be less than 10%, less than 5%, less than 2%, even less than 1%. A suitable layer property deviation margin depends on the type of layer property under consideration; particular layer properties allow larger deviations than others, without being detrimental to the quality of the applied coating.

It is an advantage of embodiments of the present invention that systems and methods are provided that allow sputtering of large area surfaces with a uniform distribution of a layer property such as for instance thickness, an optical or electrical characteristic, resistance or transmission; and a minimized amount of contaminating or defect generating particles. It is an advantage of embodiments of the present invention that the uniform distribution of such layer property across one dimension of the complete substrate can be controlled by controlling the second drive means and without significantly being impacted by the first drive means.

In particular embodiments of the present invention, for instance where the substrate is fixed, the movement in the second direction allows moving a target along the substrate, for instance, but not limited thereto, parallel with the substrate. It is an advantage of embodiments of the present invention that the direction of the spatial particle ejection distribution is maintained while its position can be changed in at least one dimension. This allows to uniformly sputter target material along a curve on the substrate defined by a projection of a sputter location of the target onto the substrate, under the relative movement between target and substrate. In particular embodiments, this allows to uniformly sputter target material on the substrate in a direction corresponding to a perpendicular projection of the second direction on the substrate, further also called the fourth direction. By moving the target in the second direction along the substrate the target material is integrated over the substrate plane in the fourth direction. In alternative embodiments of the present invention, for instance where the substrate moves within a sputter chamber, the movement of the target in the second direction allows moving a target transverse to the substrate movement. In particular embodiments this allows to keep the distance between substrate and target fixed, such that sputter material may be uniformly deposited on the substrate in a length direction of the substrate.

It is an advantage of embodiments of the present invention that the first drive means does not substantially change the spatial particle ejection distribution from the target; neither in position nor in direction, and hence does not impact the uniformity of the distribution of the layer property for instance in the length direction, e.g. the fourth direction, of the sputtered layer on the substrate. The first drive means provides a rotational movement of the target around its axis, but without movement of the magnetic system, nor of the plasma. Hence there is no impact of the rotational movement of the first drive means on the electromagnetic field that generates the plasma, and hence there is no impact of the rotational movement of the first drive means on the sputter distribution. In embodiments of the present invention the target utilization can be increased by rotating the target with the first drive means. It is thereby an advantage that the first drive means is not impacting the uniformity of the distribution of the layer property along the length direction of the substrate, e.g. the fourth direction. As an example, when sputtering with a sputter device in accordance with embodiments of the present invention the spread in thickness of the coating over the area of the substrate may be smaller than 10%, preferably smaller than 5%, more preferably smaller than 3% of the thickness of the coating. Variations in thickness of the coating cause artefacts, for instance variations in resistivity. Therefore it is an advantage if coatings with a uniform thickness can be realized. In embodiments of the present invention the concentration of contaminating or defect generating particles (e.g. particles in the micrometer range) is smaller than in systems where the substrate is moved. Whether a particle of a certain size is impacting the quality of the coating depends on the application (e.g. for TFT back planes).

It is an advantage of embodiments of the present invention that it is not required to move the substrate. Moving the substrate may be a main cause of appearance of contaminating or defect generating particles in the deposited coating on the substrate. It is not required to translate nor to rotate the substrate to obtain a uniform coating over the complete substrate. However, according to embodiments of the present invention, it is not excluded that the substrate is moved.

It is an advantage of embodiments of the present invention that cylindrical targets, also called tubular or rotatable targets, can be used. Such targets are advantageous because of their efficiency compared with planar targets. A typical planar target without magnet movement has a material utilization between 20 and 35%. A planar magnetron with moving magnets may achieve anywhere between 40 and 55% material utilization. However in this specific case, the effect of magnet movement in such planar magnetron systems may correspond with the effect of the first drive means relative to the present invention. In the case of magnet movement in planar magnetron systems, the effect of the movement in the second direction will be perturbed by the movement of the magnets, and the second drive means alone cannot control the uniformity of the layer in the second direction. This is different from the present invention, where the movement of the target by the first drive means does not impact the uniformity of the layer in the length direction of the substrate.

A cylindrical magnetron, due to the actuation by the first drive means, imposing a rotational movement around its longitudinal axis, typically has more than 70% target material utilization and goes up to 90%. Other advantages of rotatable targets are:

No change of angular material flux during target lifetime (because no groove formation), so the target can be used much longer before maintenance is needed by replacement;

More efficient cooling and having each target area only for limited time in the hot plasma zone, may allow for higher power levels and thus faster deposition; giving more throughput for a given coater investment;

Having a larger material inventory on similar dimensions of target width because of the circumferential availability of material;

More stable in reactive processes because there is no re-deposition on the target; More efficient as an anode in AC sputtering.

It is an advantage of embodiments of the present invention, in particular for instance embodiments with fixed substrates, that the distance over which the end block can be moved in the second direction, if this second direction is substantially in the length direction of the substrate, is between 200 mm and 6000 mm, preferably between 500 mm and 3000 mm. The typical width of a single magnetron is about 200 mm. The largest glass length standard is 6000 mm. Therefore, a movement in the second direction substantially along the length direction of the substrate, the movement being of up to more than 6000 mm, allows moving the target across and beyond the largest standard glass length. If the cylindrical target can be moved in the second direction substantially along the length direction of the substrate over a distance of 500 mm, a Gen 3 glass substrate can be crossed. If the cylindrical target can be moved in the second direction substantially along the length direction of the substrate over a distance of 3000 mm, a Gen 8 glass substrate can be crossed. It is an advantage of embodiments of the present invention the movement of the end block in the second direction substantially along the length direction of the substrate is not necessarily a linear movement. In embodiments of the present invention, with a fixed substrate, it may be advantageous if the second direction is curved. In some embodiments such curvature may be parallel with the curvature of a curved substrate. In these embodiments the distance between the target and the substrate is always the same when moving the target along the second direction. However, also with flat substrates it may sometimes be advantageous if the movement of the at least one end block is curved or includes a curved portion. Alternatively, the second direction does not need to be along the length direction of the substrate, but can also be, for instance, along the width direction of the substrate. In particular embodiments, the movement in the second direction can be a combination of movements along the length and along the width direction of the substrate.

It is an advantage of embodiments of the present invention, in particular for instance embodiments with moving substrates, that the distance over which the end block can be moved in the second direction, is sufficient to overcome any substrate shape variations in depth, such that the distance between the substrate and the target can be kept constant, so as to more easily enable deposition of a layer on the substrate, with uniform layer property along the length direction. It is an advantage of embodiments of the present invention, in particular if a target is too small to cover the whole substrate width, that the distance over which the end block can be moved in the second direction is sufficient to cover the whole width of the substrate, in different passes.

In embodiments of the present invention the second drive means may apply a constant speed to the cylindrical target in its movement along the second direction. In alternative embodiments, the speed of the cylindrical target in the second direction does not need to be constant. The variable speed applied by the second drive means may be an interesting way of influencing uniformity in the length direction. The speed of movement applied by the second drive means may be variable depending on the shape and curvature of the substrate to be sputtered on, and/or on the distance between the substrate and the target.

In a sputter device according to embodiments of the present invention, in particular embodiments with a fixed substrate, the second drive means may be adapted for applying a movement to the at least one end block in the second direction over more than twice the width of an end block. The second drive means may be adapted for applying a movement to the at least one end block in the second direction over substantially the whole length of the substrate.

In embodiments of the present invention, "a significant portion of the movement trajectory along the second direction" may be defined as at least 50%, for instance at least 70%, at least 80%, at least 90% of the movement trajectory. In embodiments with a fixed substrate, this may correspond to at least 50%, for instance at least 70%, at least 80%, at least 90% of the dimension in the length direction, e.g. fourth direction, of the surface to be coated.

In a sputter device according to particular embodiments of the present invention, the second drive means may be adapted for applying a movement to the at least one end block in the second direction such that the target axis is kept parallel with its original position over the complete 100% movement in the second direction. In alternative embodiments, the second drive means may be adapted for applying a movement to the at least one end block in the second direction such that the target axis is kept parallel over the movement in the second direction when the end block is in front of the substrate, but not necessarily when it is in a position aside the substrate. Hence the direction of the target axis which is kept parallel along at least a significant portion of the movement trajectory along the second direction does not necessarily need to be parallel to the original position of the target axis, nor to its end position, but may do so.

In a sputter device according to embodiments of the present invention, the first drive means can operate in vacuum conditions or the first drive means may be provided inside a sealed box which can be moved together with the at least one end block by the second drive means.

It is an advantage of embodiments of the present invention that the first drive means can operate in vacuum conditions and therefore can be moved together with the at least one end block within the vacuum chamber while providing a rotational movement to the cylindrical targets mounted to the one or more end blocks.

It is an advantage of other embodiments of the present invention that no expensive drive means are required which can operate in vacuum. This advantage is realized by providing the first drive means in a sealed box.

It is an advantage of embodiments of the present invention that, with regard to the uniformity of the sputtered coating, the rotational movement of the target by the first drive means does not interfere with the movement of the target in the second direction. In embodiments of the present invention, the first drive means is configured for not substantially changing the spatial particle ejection distribution from the target, while the second drive means is configured for maintaining the direction of the spatial particle ejection distribution.

A sputter device according to embodiments of the present invention may comprise at least one cylindrical target wherein the at least one cylindrical target is mounted on the at least one end block comprising seals for sealing between the end block and the cylindrical target. It is an advantage of embodiments of the present invention that the cylindrical target can be rotated by the first drive means while maintaining a vacuum in the sputter chamber.

A sputter device according to embodiments of the present invention may moreover comprise a sputter chamber having a wall, and in the sputter chamber a substantially statically positioned substrate may be provided, wherein the first direction is substantially parallel, for instance parallel, with the substrate. The sputter device may comprise a second seal for sealing between the sputter chamber wall and a means for moving the end block in the second direction whereby the means for moving the end block may be adapted for being driven by the second drive means. It is an advantage of embodiments of the present invention that the second seal permits moving the end block in the second direction while maintaining a vacuum in the sputter chamber. A sputter device according to alternative embodiments of the present invention may comprise a sputter chamber having a wall, and within the sputter chamber a substrate may be moved, wherein the first direction is substantially parallel, for instance parallel, with the width direction of the substrate.

A sputter device according to embodiments of the present invention may comprise a plurality of end blocks, at least a first end block being adapted for holding at least one first cylindrical target and a second end block being adapted for holding at least one second cylindrical target.

It is an advantage of embodiments of the present invention that a coating comprising two or more different materials can be sputtered on the substrate or substrates. It is an advantage of embodiments of the present invention that multiple materials can be coated in one process step, i.e. without having to break the vacuum in the vacuum chamber. It is for example not required, in particular embodiments of the present invention, to move the substrate or substrates from one sputter device to another sputter device like it is the case in cluster coaters. However, embodiments of the present invention do not exclude the use of cluster coaters for applying different layers in a stack. In addition, many applications have a coating stack consisting of multiple layers (more than two), however, containing a certain material to be repeated at least one time in the stack. Typical anti-reflective coating stacks consists of four or more layers in which two materials are repeated in the stack with varying thicknesses.

A sputter device according to embodiments of the present invention may comprise a third drive means for driving a longitudinal magnet configuration which can be placed in a cylindrical target. In embodiments of the present invention, the third drive means allows to define the uniformity of the layer sputtered on the substrate in a direction on the surface of the substrate corresponding to a perpendicular projection on the substrate of the first direction.

The longitudinal magnet configuration, when placed in the cylindrical target, is oriented in the first direction. The longitudinal magnet configuration may comprise a plurality of magnet structures along the length of the magnet configuration, whereby the magnet structures can be translationally moved by the third drive means so as to bring them closer to or further away from the target surface. This translational movement can be applied to one or more magnet structures of the plurality of magnet structures along the length of the magnet configuration. The translational movement of the magnet structures can be applied only on one or more limited portions along the first direction, or on a larger portion, or even along the complete magnet configuration. Along the first direction, different magnet structures may be moved individually or multiple magnet structures may be moved together. Different translational movements may be applied to different magnet structures in parallel on individual portions of the magnet configurations along the first direction. This way, the magnetic configuration may be changed locally so that the spatial particle ejection distribution on a certain zone on the target along the first direction may be altered, e.g. changed in amplitude, The third drive means may change the local flux intensity, but it may also change the angular distribution locally in any other way. It is an advantage of embodiments of the present invention that the uniformity of the substrate in the direction of the perpendicular projection of the first direction on the substrate can be modified by moving individual magnet structures using the third drive means.

It is an advantage of embodiments of the present invention that besides a translational movement of the magnet structures also a rotational movement of the magnet structures is possible, imposed by a fourth drive means. This allows to rotate the magnet structure around a longitudinal axis of a target. The fourth drive means provide a change to the magnetics globally, so that the direction of the spatial particle ejection distribution can be changed, e.g. rotationally along an axis parallel to the first direction. Rotation of the magnet structure changes the plasma orientation, hence the sputter behavior of the target. The rotational movement can be applied to one or more magnet structures of the plurality of magnet structures along the length of the magnet configuration. The rotational movement of the magnet structures can be applied only on one or more limited portions along the first direction, or on a larger portion, or even along the complete magnet configuration. Along the first direction, different magnet structures may be rotated individually or multiple magnet structures may be rotated together. Different rotational movements may be applied to different magnet structures in parallel on individual portions of the magnet configuration along the first direction. Also combinations of translational and rotational movements may be applied to the magnet structures, individually or combined.

The translational movement of the magnet structures and the rotational movement of the magnet structures can both be applied on a same magnet bar, or only one of the movements can be applied.

It is an advantage of embodiments of the present invention that the plasma orientation and/or strength can be modified while sputtering on the substrate. This can be done by modifying the position of the magnet structures along the magnet configuration during sputtering.

It is an advantage of embodiments of the present invention that the uniformity of a layer property, e.g. thickness, of the sputtered coating on the substrate in the fourth direction can be modified using the third and/or fourth drive means provided this is done in combination with and synchronized with a movement generated by the second drive means. In any case, in accordance with embodiments of the present invention, the movement applied to the at least one target by the first drive means does not influence the uniformity of the layer property, e.g. thickness; in the length direction.

A sputter device according to embodiments of the present invention may comprise a cathode assembly adapted for holding one or more end block(s), each adapted for mounting a cylindrical target, in an array configuration, for instance a carousel configuration. The one or more particular cylindrical targets can be oriented towards a substrate and can be selected for being powered during sputtering.

It is an advantage of embodiments of the present invention that multiple different materials can be sputtered on the substrate in one process step (i.e. without the need for opening the sputter chamber and releasing the vacuum for being able to change the target material). Furthermore, complex coating stacks may be deposited quite uniformly on a relatively large 2D surface without the need for moving the surface.

A sputter device according to embodiments of the present invention, may comprise a controller adapted for controlling the speed of the at least one end block in the second direction and/or, the power applied to the at least one cylindrical target and/or, the rotation speed of the at least one cylindrical target and/or, the position of a magnet bar within the at least one cylindrical target, and/or the gas flow and/or partial pressure distribution of the various gas species close to the at least one cylindrical target and/or the substrate.

It is an advantage that the control parameters for controlling the uniformity of a particular property of the coating layer or stack of layers, e.g. thickness, can be controlled from a centralized controller.

It is an advantage of embodiments of the present invention that the movement of a first cylindrical target can be synchronized with the movement of a second cylindrical target through a single controller.

In a sputter device according to particular embodiments of the present invention, the movement of the at least one end block in the second direction applied by the second drive means may be a linear movement.

In a sputter device according to particular embodiments of the present invention, the speed of the at least one end block along the second direction may be constant.

In a second aspect, the present invention provides a method for sputtering a substrate in a vacuum chamber. The substrate has a length in a length direction and a width in a width direction. The substrate may be substantially statically positioned, or the substrate may be moving during sputtering. The method comprises the step of rotating a cylindrical target around its longitudinal axis oriented in a first direction, while moving the cylindrical target in a second direction. The movement in the second direction is such that a layer property of the deposited layer on the substrate along a curve on the substrate, defined by a projection of a sputter location of the target onto the substrate under the relative movement between target and substrate, deviates less than a predetermined layer property deviation margin. The second direction may be, but does not need to be, perpendicular to the first direction. The second direction may be, but does not need to be, along the length direction of the substrate. The movement in the second direction may be such that the distance between the target and the substrate is constant during sputtering. The movement in the second direction defines the uniformity of a layer sputtered on the substrate in the fourth direction on the surface of the substrate, the movement by the first drive means not impacting the uniformity of the layer sputtered on the substrate in a direction in which the second drive means is impacting the uniformity (the fourth direction) of the fixed substrate.

It is an advantage of particular embodiments of the present invention, where the method is applied to a fixed substrate, hence a substrate that is not moving during sputtering, that a large surface can be coated by means of a cylindrical target without moving the substrate. Moving the substrate may be a main cause of presence of contaminating or defect generating particles in the sputtered coating. It is an advantage of particular embodiments of the present invention that the target can be sputtered with high efficiency with regard to the use of sputtered target material due to the rotation of the cylindrical target. Even if the target is smaller than the substrate width, due to the end block being movable along the substrate width in a 3D trajectory, the whole substrate can be covered with a coating, in different passes, by subsequently locating the target at different positions along the substrate width.

It is an advantage of alternative embodiments of the present invention, where the method is applied to a moving substrate, hence a substrate that is moving during sputtering, that a layer with uniform layer properties can be sputtered, even onto substrates with a difficult shape or being transported along a non-linear movement or having a variable spacing between the substrate surface and the (optionally fixed) target surface.

A method according to embodiments of the present invention may moreover comprise moving magnet structures inside the cylindrical target. The movement of the magnet structures inside the cylindrical target may be a translational movement, in which different magnet structures along a magnet bar are shifted "up or down" so as to bring them closer to or further away from the target surface. It is an advantage of embodiments of the present invention that, this way, the uniformity of a property of the coating along a first dimension can be controlled. The translational movement can be applied to one or more magnet structures of the plurality of magnet structures along the length of the magnet configuration. The translational movement of the magnet structures can be applied only on one or more limited portions along the first direction, or on a larger portion, or even along the complete magnet configuration. Along the first direction, different magnet structures may be moved individually or multiple magnet structures may be moved together. Different translational movements may be applied to different magnet structures in parallel on individual portions of the magnet configurations along the first direction.

The movement of the magnet structures inside the cylindrical target may be a rotational movement around a longitudinal axis of a cylindrical target. This allows re-orientation of the magnetic field, hence amendment of sputter parameters. The rotational movement can be applied to one or more magnet structures of the plurality of magnet structures along the length of the magnet configuration. The rotational movement of the magnet structures can be applied only on one or more limited portions along the first direction, or on a larger portion, or even along the complete magnet configuration. Along the first direction, different magnet structures may be rotated individually or multiple magnet structures may be rotated together. Different rotational movements may be applied to different magnet structures in parallel on individual portions of the magnet configuration along the first direction.

The translational and the rotational movement of the magnet structures inside the cylindrical target may be applied separately or simultaneously.

In a method according to embodiments of the present invention, in a first step, a set of at least one first cylindrical target is moved in a second direction of the sputter chamber and, in a second step, a set of at least one second cylindrical target is moved in the second direction of the sputter chamber. It is an advantage of particular embodiments of the present invention that a multilayer stack can be deposited on the substrate without the need of moving the substrate, and without the need of breaking the vacuum in the vacuum chamber. It is an advantage of embodiments of the present invention that the set comprising the at least one first cylindrical target can be moved in the second direction at the same or different path and/or speed conditions as the set comprising the at least one second cylindrical target.

In a third aspect, the present invention provides a controller for controlling movement of at least one cylindrical target in a vacuum chamber of sputter device, the movement comprising a first component being a rotational movement around its longitudinal axis oriented in a first direction, and a simultaneous second component being a translational movement in a second direction, thereby keeping the target axis parallel during at least a significant portion of the movement trajectory along the second direction. The cylindrical target is configured for spatial particle ejection distribution in an average ejection direction. The rotational movement does not substantially change the spatial particle ejection distribution from the target. Simultaneously, the second movement maintains the direction of the spatial particle ejection distribution, which its position is changed in at least one dimension. In accordance with embodiments of the present invention, such simultaneous rotational and translational movement of the target allows a layer to be deposited on the substrate with a layer property along a curve on the substrate, defined by a projection of a sputter location of the target onto the substrate under the relative movement between target and substrate, that deviates less than a predetermined layer property deviation margin. The second direction may be, but does not need to be, perpendicular to the first direction. The second direction may be, but does not need to be, along the length direction of the substrate. The second direction may be substantially perpendicular to the width direction of the substrate.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other aspects of the invention will be apparent from and elucidated with reference to the embodiment(s) described hereinafter.

Figure 1:
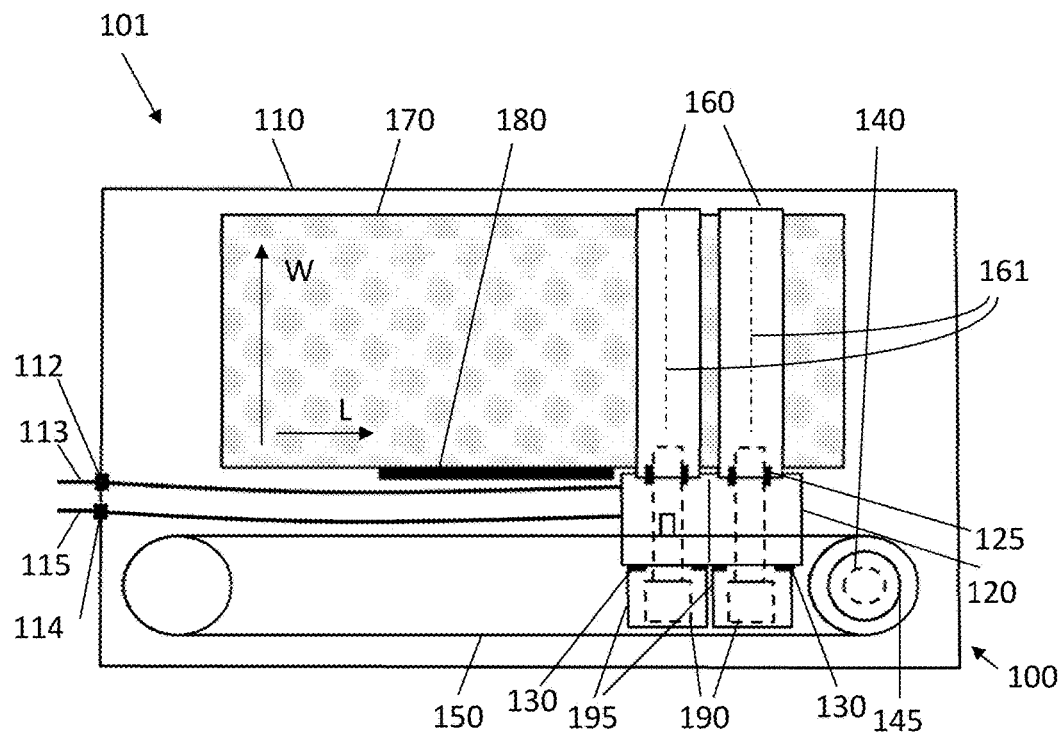
FIG. 1 schematically shows a side view of a sputter device in accordance with embodiments of the present invention, comprising two end blocks onto each of which a cylindrical target is mounted.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Particular embodiments of the present invention are described hereinbelow, wherein the second direction takes particular orientations. It is to be noted, however, that the invention is not limited to the described embodiments, and that embodiments that are not described in detail, for instance where the second direction is parallel to the first direction, or has a component along the first direction, do also form part of the present invention, and are also covered by the appended claims.

Embodiments of the present invention relate to a sputter device for use in a sputter system. The sputter system may be a sputter coater, for instance a coater of the type "cluster coater". A cluster coater is a coating system in which different process modules can be arranged in any desired manner on a central processing or treatment chamber.

Where in embodiments of the present invention reference is made to "a static seal" reference is made to a means which permits to seal the contact between two surfaces which are not moving with respect to one another.

Where in embodiments of the present invention reference is made to "a dynamic seal" reference is made to a means which permits to seal the contact between two surfaces which are moving with regard to one another.

Both types of seals permit to keep a vacuum on one side of the seal and an atmospheric pressure on the other side of the seal.

Where in embodiments of the present invention reference is made to the "first direction", reference is made to the direction of the longitudinal axis of a cylindrical target mounted on an end block. In embodiments of the present invention the first direction is parallel with the substrate. The corresponding direction on the surface of the substrate, i.e. the perpendicular projection of the first direction on the surface of the substrate, is called the "third direction". The first direction may be a vertical direction.

Where in embodiments of the present invention reference is made to the "second direction", reference is made to the direction of a translational movement of the target. The movement in the second direction may be a movement along the substrate, for instance in case of a substantially static substrate (substantially not moving during sputtering), but also in case of a moving substrate. In embodiments of the present invention the second direction is parallel with the substrate, for instance along the length or the width of the substrate (e.g. also when the substrate is curved in the second direction). However, the present invention is not limited thereto, as will be explained below. Alternatively, the movement in the second direction may be a movement transversal to the substrate or, for instance in case of a substrate which is moving within the sputter chamber during sputtering, e.g. perpendicular to the substrate movement direction. Such movement transversal to the substrate or substrate movement direction may be implemented so as to keep the distance between the target and the substrate constant. In embodiments of the present invention, the movement in the second direction may be a combination of a movement along the substrate and a movement transversal to the substrate or to the substrate movement direction. In particular embodiments of the present invention, the present invention not being limited thereto, the second direction is perpendicular to the first direction. If the second direction is along the substrate, then the corresponding direction on the surface of the substrate, i.e. the perpendicular projection of the second direction on the surface of the substrate, is called the "fourth direction". The fourth direction may be a horizontal direction. If the second direction is transversal to the substrate or substrate movement direction, then the perpendicular projection of a movement in this second direction, on a moving substrate, is also a curve along the fourth direction on the substrate. The curve on the substrate may be defined by a projection of a particular sputter location of the target onto the substrate under the relative movement between target and substrate.

Figure 19:
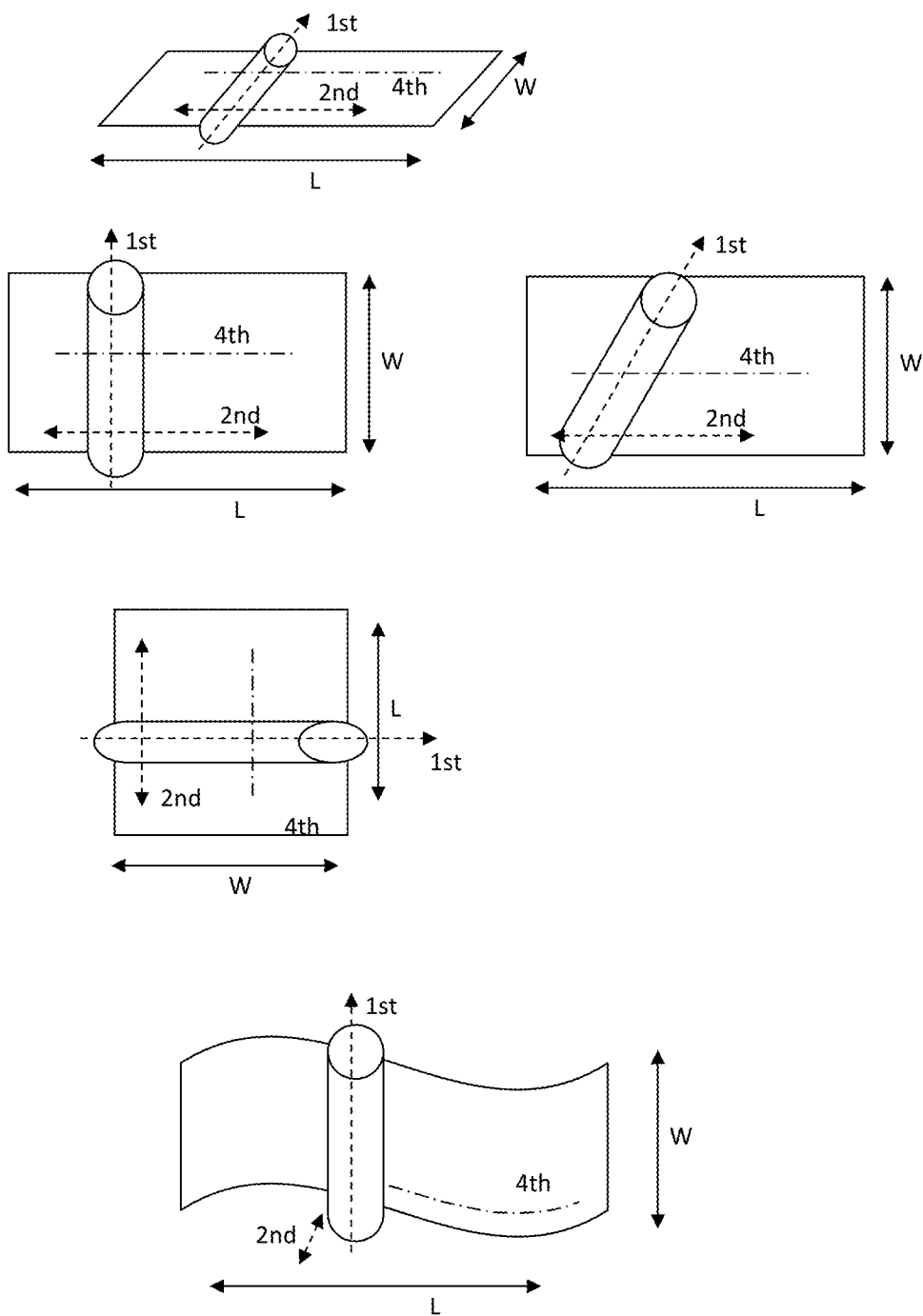
FIG. 19 illustrates different set-ups and corresponding length directions, width directions, first, second and fourth directions.

By the second drive means, the at least one end block is moved along a movement trajectory which may lie, but does not need to lie, substantially in a plane; in case it does, the second direction will lie in that plane. In practical embodiments, it is most likely that the movement trajectory will lie in a horizontal plane, although the present invention is not limited thereto. The "length direction" of a substrate may be defined as a direction along a dimension of the substrate, defined by an intersection of an intersection plane parallel to the movement plane as defined by the movement applied by the second drive means. In particular embodiments, the present invention not being limited thereto, the length direction may correspond to a horizontal line on the substrate, defined by the intersection between the substrate and a horizontal intersection plane, parallel to the movement plane defined by the movement of the at least one end block, applied by the second drive means.

Where in embodiments of the present invention reference is made to "a width direction", reference is made to a direction which is substantially covered by the longitudinal axis of the target. Different set-ups of substrates and targets are shown in FIG. 19 for illustrating width direction W and length direction L, as well as first, second and fourth directions; the present invention, however, not being limited thereto. The very first embodiment illustrates a horizontally placed substrate and a horizontally placed target. The next three embodiments illustrate a vertically mounted substrate, once with a vertically placed target, once with a target under an angle deviating from vertical, and once with a horizontally placed target. The very last embodiment illustrates a vertically mounted substrate which is, however, curved in the horizontal direction, and a vertically placed target.

In embodiments of the present invention, there is a relative movement between the target and the substrate. This may be obtained by keeping the substrate static, and moving the target along a length direction of the substrate, or it may be obtained by moving a substrate within a sputter chamber, and keeping the target at a fixed location. Also combinations are possible, in which both the target and the substrate move within the sputter chamber.

Where in embodiments of the present invention reference is made to "an end block" reference is made to a means for rotatably holding a target tube, to make it turn and to electrically feed the target tube whilst feeding and evacuating a cooling liquid to and from it. Moreover, the end-block must maintain vacuum integrity as the sputter process normally takes place at low pressures.

Where in embodiments of the present invention reference is made to "the thickness of the coating", reference is made to the thickness in a point on the substrate, measured in the direction orthogonal to the substrate surface. Where in embodiments of the present invention reference is made to "the uniformity of the coating or layer in the third/fourth direction", reference is made to a coating with a controlled uniformity of a property of the coating in the third/fourth direction. This corresponds to the layer property of the deposited layer on the substrate along a substantial portion in the length direction, of a perpendicular projection of the second direction onto the substrate, deviating less than a predetermined layer property deviation margin. The "perpendicular projection of the second direction onto the substrate" refers to the curve formed onto the substrate surface by projecting a point on the target, undergoing a movement in the second direction, onto the static or moving substrate during a sputter operation.

The property may for instance be thickness, an optical or electrical characteristic, resistance, transmission. The variation may be 10% or less, e.g. 5% or less, such as 2% or less. Where in embodiments of the present invention reference is made to "the uniformity of the coating" this is meant to be equivalent to "the uniformity of the distribution of a property of the coating".

Where in embodiments of the present invention reference is made to a "substrate", any type of surface to be coated is meant. The substrate may be flat or curved, in which case the curvature may be in one or more dimensions. The present invention is particularly useful for large surfaces to be coated, although the present invention is not limited thereto. The surface to be coated may consist of the surface of a single, for instance large, substrate; or it may comprise the surfaces a plurality of smaller substrates arranged in an array. The array may be regular or irregular. Throughout the description, "substrate" and "array of substrates" are used as synonyms for "surface to be coated".

In a first embodiment of a first aspect, the present invention relates to a sputter device 100 for sputtering large area surfaces, such as large area substrates or arrays of smaller substrates. The first embodiment of the first aspect of the present invention may relate to systems for use with a substantially static substrate, hence a substrate that is substantially not moving during sputtering. The sputter device 100 may be used in, and hence may form part of a sputter system 101. In embodiments of the present invention the length of the surface, and thus of the large area substrate or of the array of smaller substrates, may for instance be between 300 mm and 3210 mm. The width of the substrate or array of substrates may be between 300 mm and 2400 mm. Embodiments of the present invention can be used, the present invention not being limited thereto, for sputtering glass plates, for instance glass plates for displays such as for example TFT displays or electronic devices. Alternatively, embodiments of the present invention can be used, the present invention not being limited thereto, for sputtering pre-cut smaller glass plates in an array, for instance if the coating to be applied would be such that the glass plates, once coated, are too hard to be cut.

According to embodiments of the present invention the sputter device 100 comprises at least one end block 120 adapted for each holding a cylindrical target 160. The cylindrical target 160 is configured for spatial particle ejection distribution in an average ejection direction. If the cylindrical target 160 is mounted on the end block 120 its axis 161 is oriented in a first direction, extending from the end block 120. In use, when the sputter device 100 is provided with a target, and is mounted in a sputter system 101 for sputtering, the first direction will preferably be parallel to a direction in the surface of the substrate 170 or array of substrates. This direction is called hereinafter the third direction. If the first direction is not parallel to a direction in the surface of the substrate 170, the corresponding third direction is the direction of a perpendicular projection of the first direction onto the substrate surface. The first direction may for instance be, but does not need to be, a vertical direction, in which case the third direction corresponds to the width direction of the substrate 170 or array of substrates.

The sputter device 100 moreover comprises a first drive means 190 for providing rotational movement of the at least one cylindrical target 160 around its longitudinal axis 161. The first drive means, when driving the target for rotation, does not substantially change the spatial particle ejection distribution from the target. The sputter device 100 also comprises a second drive means 145 for applying a movement to the at least one end block 120 in a second direction. The second drive means drives the end block in a translational movement such that the direction of the spatial particle ejection distribution is maintained while its position can be changed in at least one dimension. The first and the second drive means are adapted for, during sputtering, being simultaneously operational in the vacuum chamber. Hence both the rotational movement of the target and the translational movement of the end block carrying the target (and thus of the target) take place simultaneously.

In embodiments of the present invention, the second direction may be defined in a movement plane, for instance in a horizontal plane. A length direction of the substrate may be defined as a direction along a dimension of the substrate, defined by an intersection of an intersection plane parallel to the movement plane as defined by the movement applied by the second drive means. The applied movement in the second direction may be over more than once the width of the end block 120. In the embodiments as the one illustrated in FIG. 1, the movement in the second direction may be applied over substantially the whole length, even over the whole length or even over more than the whole length of the substrate or array of substrates. A fourth direction is defined on the surface of the substrate, corresponding to the perpendicular projection of the second direction on the surface of the substrate. This fourth direction may typically correspond to the length of the substrate 170 or array of substrates.

In use, when the sputter device 100 is provided with a target, and is mounted in a sputter system 101 for sputtering, the second direction may be a direction along the length of the substrate 170. The second direction may be, but does not need to be, parallel to the surface of the substrate 170. The second direction may be, but does not need to be, perpendicular to the first direction. If the substrate 170 is curved, the second direction may follow, but does not need to follow, the curvature of the substrate 170. In alternative embodiments, the second direction may be along the first direction, or have a component parallel to the first direction.

When moving the end block 120 in the second direction the target axis 161 remains parallel during at least a significant portion of the movement trajectory along the second direction, for instance over at least 50% of the dimension in the fourth direction of the surface to be coated, which corresponds to the length direction of the substrate. The target axis 161 may remain, but does not need to remain, parallel with its original position. In accordance with embodiments of the present invention, the movement of the end block 120 by the second drive means defines the uniformity in the fourth direction, corresponding to the length direction, of a layer sputtered on a fixed substrate 170. The substrate 170 or array of substrates may be a planar substrate or a curved substrate, and if a curved substrate, the curvature may be in one or two dimensions. According to embodiments of the present invention, the movement of the at least one cylindrical target 160 around its rotational axis 161, induced by the first drive means 190, does not impact the uniformity in the fourth direction, corresponding to the length direction, of the layer sputtered on the substrate 170. This is because the rotational movement of the target does not substantially change the spatial particle ejection distribution from the target.

Figure 11:
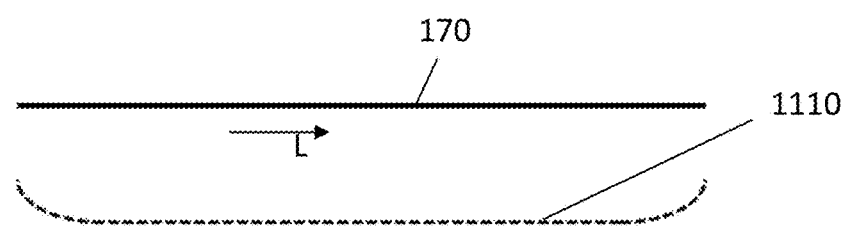
FIG. 11 schematically shows an end block movement trajectory in front of a substrate in accordance with embodiments of the present invention.
Figure 12:
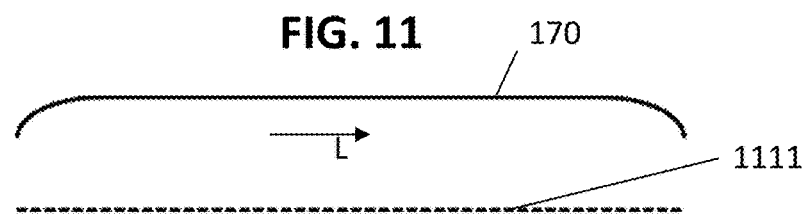
FIG. 12 shows schematically an end block movement trajectory in front of a substrate in accordance with alternative embodiments of the present invention.
Figure 14:
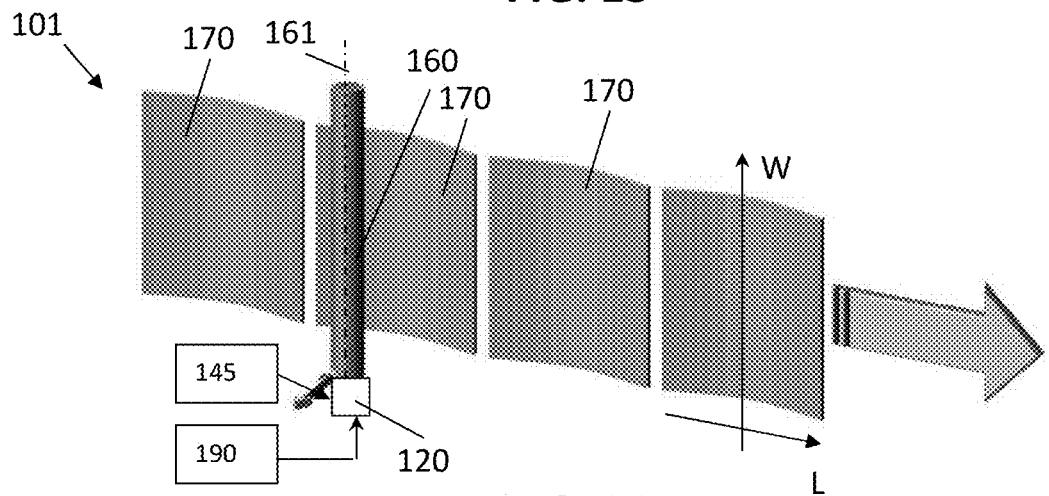
FIG. 14 is a schematic 3D illustration of an embodiment of the present invention for use with moving substrates.

In embodiments of the present invention the movement of the end block 120 in the second direction is a movement parallel with the substrate 170 or array of substrates. This may be a linear movement in case a flat substrate 170 or array of substrates is sputtered or it may be a curved movement in case the substrate 170 or array of substrates is curved or piecewise linear in the third or fourth direction, corresponding to the width and length direction, respectively, of the substrate. In embodiments of the present invention the movement of the at least one end block 120 in the second direction is not necessarily parallel to the surface of the substrate 170 or array of substrates. Examples thereof are illustrated in FIG. 11 and FIG. 12, which are simplified schematic top views of sputter systems. The movement trajectory 1110, 1111 of the at least one end block 120 is shown in dotted lines and the substrate 170 is shown as a full line. In the system illustrated in FIG. 11 the substrate is a planar substrate, and the movement trajectory 1111 deviates from a straight line, especially at the level of the extremities of the substrate 170. In the system illustrated in FIG. 12 the substrate is a curved substrate, and the movement trajectory 1111 deviates from being parallel to the curved surface of the substrate 170, especially at the level of the extremities of the substrate 170. In particular embodiments, depending on the actual curvature of the substrate, the movement trajectory 1111 may be allowed to be a straight line. In embodiments of the present invention the cylindrical target 160 is oriented in the first direction which is parallel with the substrate surface, and which remains parallel with the substrate or array of substrates while moving the end block 170 in the second direction. An alternative embodiment is illustrated in FIG. 14, where the second direction is transversal to the movement direction of the substrate.

The uniformity of the sputtered coating in the length direction of the substrate, might be controlled by changing the distance between the cylindrical target and the substrate or array of substrates, e.g. by the movement in the second direction. In accordance with embodiments of the present invention, it is, however, not influenced by the movement induced by the first drive means, i.e. the rotation around the target axis 161 in the first direction. Alternatively or in combination therewith, the uniformity of the sputtered layer in the fourth direction, corresponding to the length direction, might be controlled by controlling the translational speed along the second direction of the at least one end block 160. Yet another control means for controlling the uniformity of the sputtered layer in the fourth direction might be the control of the power level on the at least one target 16 while traversing the substrate 170 or array of substrates. These techniques may all be used per se for controlling the uniformity of the sputtered layer in the fourth direction, corresponding to the length direction, or they may be used in combination. In the layer sputtered onto the substrate in accordance with embodiments of the present invention, a layer property, for instance thickness or an electrical or optical property, of the deposited layer on the substrate along a substantial portion in the length direction, deviates less than a predetermined layer property deviation margin. The predetermined layer property deviation margin determines the degree of uniformity of the sputtered layer.

In embodiments of the present invention the translational speed of the end block along the second direction, when moving in front of the substrate 170 or array of substrates, might be constant. The end block 120 carrying the target 160 might be moving beyond the substrate 170 or array of substrates, i.e. over a length larger than the length of the substrate 170 or array of substrates, such that the movement speed when the target 160 is in front of the substrate 170 or array of substrates is constant and such that the speed is only decreased after having moved beyond the substrate 170 or array of substrates. Similarly the translational speed may be increased up to a constant level which is reached before the end block 120 carrying the target 160 is positioned in front of the substrate 170 or array of substrates.

In a further embodiment of the first aspect, the present invention also relates to a sputter device for sputtering large area surfaces, such as large area substrates or arrays of smaller substrates. This further embodiment of the first aspect of the present invention may relate to systems for use with moving substrates, hence where a substrate is moved within the sputter chamber during sputtering. The sputter device may be used in, and hence may form part of a sputter system. In embodiments of the present invention the length of the surface, and thus of the large area substrate or of the array of smaller substrates, may for instance be between 300 mm and 6000 mm. The width of the substrate or array of substrates may be between 300 mm and 3210 mm. Embodiments of the present invention can be used, the present invention not being limited thereto, for sputtering glass plates, for instance glass plates for displays such as for example TFT displays or electronic devices. Alternatively, embodiments of the present invention can be used, the present invention not being limited thereto, for sputtering pre-cut smaller glass plates in an array, for instance if the cutting operation would have a negative impact on the coated glass plates.

According to embodiments of the present invention the sputter device comprises at least one end block 120 adapted for each holding a cylindrical target 160. If the cylindrical target 160 is mounted on the end block 120 its axis 161 is oriented in a first direction, extending from the end block 120. In use, when the sputter device 100 is provided with a target, and is mounted in a sputter system 101 for sputtering, the first direction will preferably be parallel to a direction in the surface of the substrate 170 or array of substrates. This direction is called hereinafter the third direction. If the first direction is not parallel to a direction in the surface of the substrate 170, the corresponding third direction is the direction of a perpendicular projection of the first direction onto the substrate surface. The first direction may for instance be, but does not need to be, a vertical direction, in which case the third direction corresponds to the width direction of the substrate 170 or array of substrates.

The sputter device moreover comprises a first drive means 190 for providing rotational movement of the at least one cylindrical target 160 around its longitudinal axis 161. The sputter device 100 also comprises a second drive means 145 for applying a movement to the at least one end block 120 in a second direction. The applied movement in the second direction may be in a direction transversal to the substrate or to the substrate movement direction, as in the embodiment illustrated in FIG. 14. The movement in the second direction may be such that the distance between the target 160 and the substrate 170 is substantially constant.

When moving the end block 120 in the second direction, the target axis 161 remains parallel during at least a significant portion of the movement trajectory along the second direction, and preferably during the complete movement trajectory. The target axis 161 may remain, but does not need to remain, parallel with its original position. In accordance with embodiments of the present invention, the movement of the end block 120 by the second drive means defines the uniformity of a layer sputtered on the moving substrate 170, in the fourth direction, on the substrate. In the layer sputtered onto the substrate in accordance with embodiments of the present invention, a layer property, for instance thickness or an electrical or optical property, of the deposited layer on the substrate along a substantial portion in the length direction, of a perpendicular projection of the second direction on the moving substrate, deviates less than a predetermined layer property deviation margin. The predetermined layer property deviation margin determines the degree of uniformity of the sputtered layer.

The substrate 170 or array of substrates may be a planar substrate or a curved substrate, and if a curved substrate, the curvature may be in one or two dimensions. According to embodiments of the present invention, the movement of the at least one cylindrical target 160 around its rotational axis 161, induced by the first drive means 190, does not impact the uniformity in the fourth direction of the layer sputtered on the substrate 170.

In embodiments of the present invention the movement of the end block 120 in the second direction is a movement transversal to the substrate 170 or array of substrates, or transversal to the substrate movement direction, such that the distance between the target and the substrate 170 or array of substrates is kept constant.

The uniformity of the sputtered coating in the fourth direction of the substrate, might be controlled by changing the distance between the cylindrical target and the substrate or array of substrates. In accordance with embodiments of the present invention, it is, however, not influenced by the movement induced by the first drive means, i.e. the rotation around the target axis 161 in the first direction. Alternatively or in combination therewith, the uniformity of the sputtered layer in the fourth direction, might be controlled by controlling the translational speed along the second direction of the at least one end block 160. Yet another control means for controlling the uniformity of the sputtered layer in the fourth direction might be the control of the power level on the at least one target 16 while traversing the substrate 170 or array of substrates. These techniques may all be used per se for controlling the uniformity of the sputtered layer in the fourth direction, or they may be used in combination.

In embodiments of the present invention the translational movement of the end block along the second direction might go in one direction. Alternatively, the translational movement of the end block might go back and forth.

In embodiments of the present invention a cylindrical target 160 is mounted on the at least one end block 120.

According to embodiments of the present invention the sputter device 100 may be used in a larger sputter system 101 which comprises a sputter chamber 110. In the sputter chamber 110, a substrate holder 180 may be provided for mounting and holding a substantially statically positioned substrate 170 or array of substrates. The sputter device 100 according to embodiments of the present invention may be designed to fit into existing sputter systems 101. The whole sputter device 100 may for example also comprise a wall which can be sealed on an opening in the wall of the sputter chamber 110 of the sputter system 101. Typically, prior art sputter chambers have an opening in the wall which is larger the substrate dimensions. Prior art sputter chambers typically have a cavity which is big enough to allow having a plurality of targets extending beyond the substrate in order to achieve a uniform coating on the substrate.

A sputter device 100 also comprises tubing 113 for applying and evacuating cooling liquid, and tubing 115 for supplying gas (both represented in FIG. 1 in a simplified way). These tubings 113, 115 enter the sputter chamber 110 via seals 112, 114, and allow cooling water and power to be supplied to the at least one end block 120 and this way to the targets 160.

In embodiments of the present invention the first drive means 190 for providing rotational movement to the cylindrical target 160, can be any suitable drive means, e.g. an electrical motor or a hydraulic system using the flow of the cooling water. In embodiments of the present invention, the first drive means 190 can operate in vacuum conditions. In this case, the first drive means 190 must be specifically conceived and adapted for doing so. Suitable vacuum motors are available on the market. Since, in this embodiment of the invention, both the first drive means 190 as well as the second drive means 145 for driving the end block 120 simultaneously operate in the vacuum environment of the sputter chamber 110 no seal is required around the axis of the first drive means.

In alternative embodiments, the first drive means 190 is a drive means conceived for operation under pressure conditions, for instance under atmospheric pressure conditions. In this case, the first drive means 190 cannot be simply put into the vacuum chamber 110, as the low pressure available there for sputtering activity would be detrimental for proper operation of the first drive means 190. In these embodiments, the first drive means 190 may be enclosed by a sealed box 195 which is held under suitable pressure conditions, for instance under atmospheric pressure, for providing proper environmental conditions for the first drive means to function correctly. The gas pressure in the sealed box 195 can be different from the vacuum in the sputter chamber 110. Obviously the box 195 must then be sealed from the vacuum chamber 110 to keep up the right pressure values. A first seal 130 between the sealed box 195 and the at least one end block 120 seals the gas pressure in the sealed box 195 from the vacuum in the sputter chamber 110. Cooling of the sealed box 195 and/or of the first drive means 190 might be provided (not illustrated in FIG. 1) Several seals might be present for example for establishing appropriate lubrication of the bearing means which are sustaining the rotational movement of the first drive means. Other seals might be required for sustaining a good electrical transfer between electrical brushes and a commutator for passing the electrical current onto the rotating target. In embodiments of the present invention the sealed box 195 is non-deformable, more particularly non-deformable under the difference between the pressure in the chamber and the vacuum outside the chamber (but inside the vacuum chamber). In embodiments of the present invention the sealed box 195 comprises seals to keep the inside of the sealed box 195 at the desired pressure, for instance atmospheric pressure. Such seals are adapted to permit passage of cabling (e.g. sputter power cable, power cable for first drive means) and tubing (e.g. water cooling, detection lines e.g. for measuring partial pressures in between consequent seals or e.g. for measuring water leaks on the dynamic cooling seals)

Figure 5:
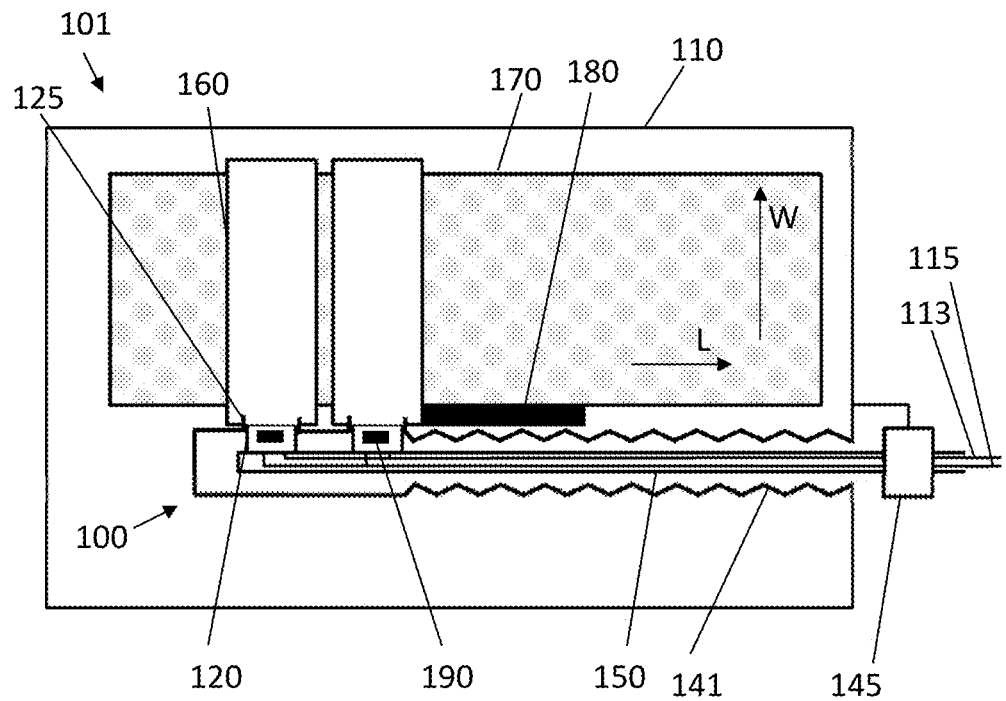
FIG. 5 shows a schematic diagram of a sputter device comprising bellows in accordance with embodiments of the present invention.

In embodiments of the present invention a mechanical means 150 (e.g. but not limited thereto a rod, gear, timing belt, piston, cable, chain, worm, . . . ) may be present for moving the end block 120 along the second direction, e.g. along a length direction of the substrate, or transversal to the substrate or substrate movement direction, or a combination thereof. In embodiments of the present invention this means 150 for moving the end block 120 may be driven from outside the sputter chamber 110 by the second drive means 145. A second seal 140 between the means 150 for moving the end block and the wall of the sputter chamber 110 seals the inner side of the sputter chamber from the outer side of the sputter chamber such that a vacuum can exist within the sputter chamber. The second seal 140 may be a dynamic seal (FIG. 3) or more commonly a static seal in case use is made of a flexible sleeve or bellows (FIG. 5). Additional seals for passing power cables and tubing for cool water may also be present in the wall of the sputter chamber 110 or may be combined with the second seal 140.

In embodiments of the present invention the means 150 (e.g. rod, gear, timing belt, piston, cable, chain, worm, . . . ) for moving the end block 120 is driven from inside the sputter chamber 110 by the second drive means 145. In these embodiments, similar as for the first drive means 190, the second drive means 145 is either able to operate in vacuum conditions or the second drive means 145 is encapsulated by an enclosure in which pressure levels different from vacuum, e.g. atmospheric pressure, can be maintained. In the last case a seal between the inside and the outside of the enclosure enables to maintain the pressure within the enclosure while moving the end block by a second drive means inside the enclosure.

Figure 2:
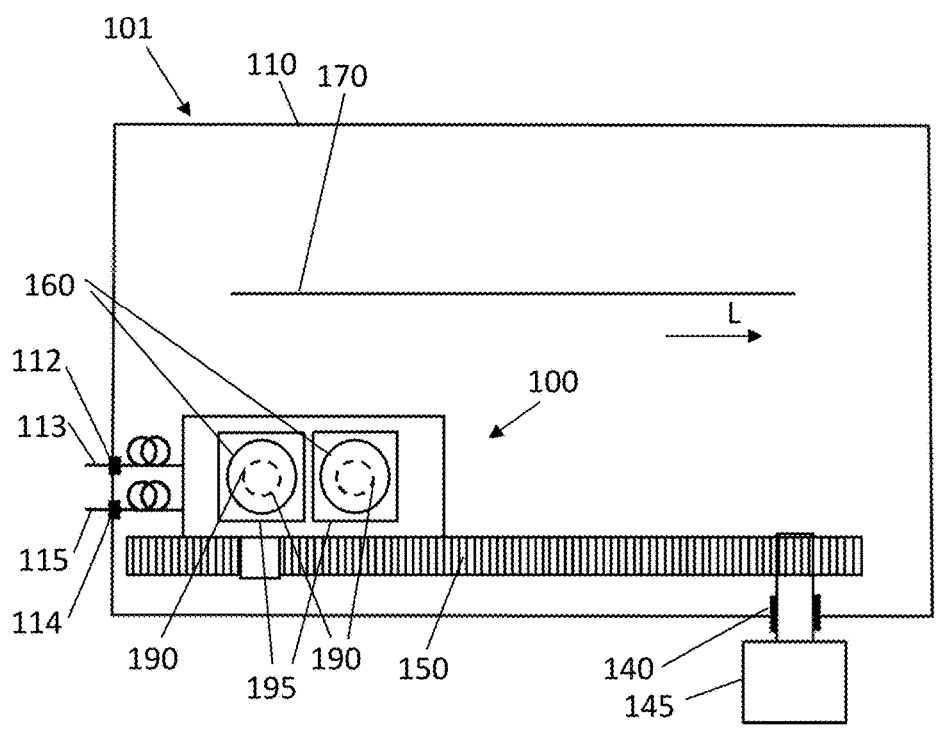
FIG. 2 schematically shows a top view of a sputter device in accordance with embodiments of the present invention.

FIG. 1 schematically shows the front view of an exemplary embodiment of a sputter system 101 comprising a sputter device 100 in accordance with the present invention. FIG. 2 shows the top view of the same embodiment. This embodiment illustrated relates to a system with a substantially fixed substrate, and a second direction along the length direction of the substrate to be coated. It is clear for a person skilled in the art how to amend this implementation for building a system where the second direction is transversal to the substrate or to the substrate movement direction.

Two sealed boxes 195 are each sealed against an end block 120 using first seals 130. In each of these sealed boxes 195 a first drive means 190 is mounted through which it is possible to rotate cylindrical targets 160 mounted onto the end blocks 120. Third seals 125 permit this rotation while keeping the vacuum in the sputter chamber 110. Through cooling tubes 113 entering the sputter chamber 110 by means of seals 112 and through a power cable 115 entering the sputter chamber by means of seal 114, cooling liquid and power are made available to the at least one end block 120. In embodiments of the present invention AC power is applied to the targets. In the embodiment illustrated in FIG. 1, the means 150 for moving the at least one end block 120 in the second direction is a chain which can be moved by a second drive means 145 which may be located inside or outside the sputter chamber 110. If the second drive means 145 is located outside the sputter chamber 110, the rotating axis may enter the sputter chamber via second seals 140. FIG. 1 and FIG. 2 also illustrate that the axes 161 of the targets 160, oriented in the first direction, are parallel to the substrate 170. The substrate 170 or array of substrates is mounted on a substrate holder 180. Compared to FIG. 1, in FIG. 2 the end blocks 120 and hence the targets 160 mounted thereon, have moved to the other side of the sputter chamber 110, along the length of the substrate 170 or array of substrates in the second direction.

Figure 3:
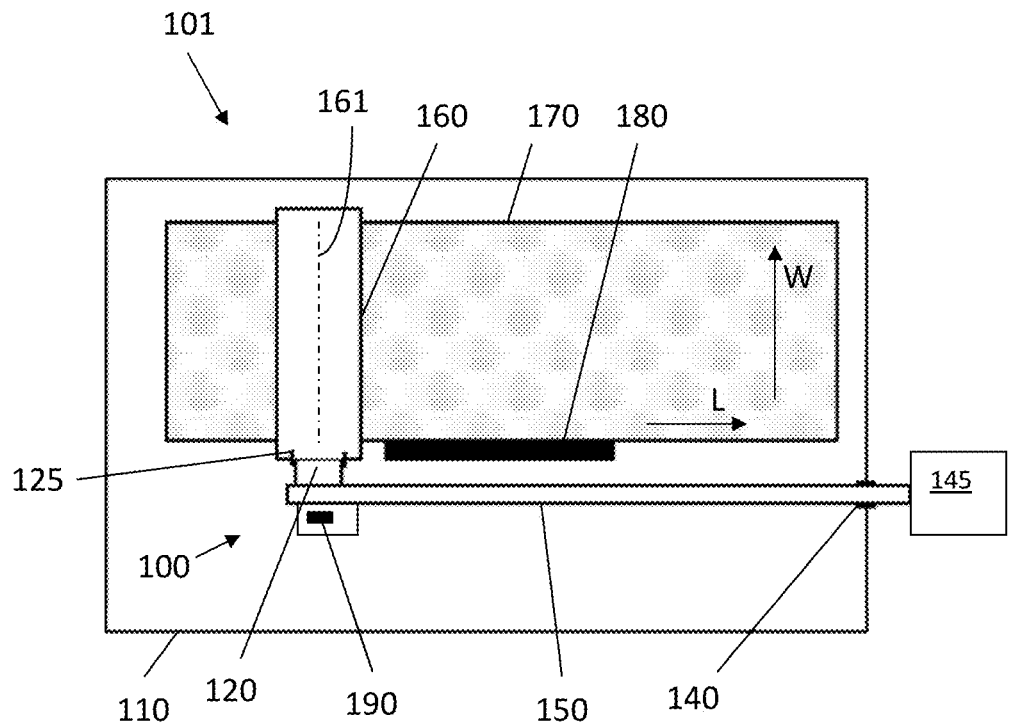
FIG. 3 shows a schematic diagram of a sputter in accordance with alternative embodiments of the present invention.

FIG. 3 shows a schematic presentation of a sputter device 100 according to an exemplary embodiment of the present invention, in a sputter system 101 for sputtering a substantially fixed substrate. It shows an end block 120 (a single end block) adapted for holding a cylindrical target 160 having a longitudinal axis 161 in a first direction. The figure also shows a first drive means 190 for providing a rotational movement of the cylindrical target 160 around its longitudinal axis 161. The sputter device 100 also comprises a second drive means 145 for applying a movement to the end block 120 in a second direction, which may be, but does not need to be, perpendicular to the first direction, thereby keeping the target axis 161 parallel along at least a significant portion of the movement trajectory along the second direction, so that the movement of the end block 120 in the second direction defines the uniformity of a layer sputtered on a substrate 170 or array of substrates in a length direction of the substrate. In the embodiment illustrated, the second direction is along the length direction of the substrate 170. The movement of the first drive means 190 does not impact the uniformity in the length direction of the layer sputtered on the substrate 170.

In embodiments of the present invention the sputter device moreover comprises a sputter chamber 110 also shown in FIG. 3. This sputter chamber 110 comprises a cylindrical target 160 mounted on the end block 120. The axis 161 of the end block 120 is thereby oriented in the first direction. The end block 120 is operationally coupled to the first drive means 190 for rotating the cylindrical target 160 around its axis 161. The figure also illustrates that the end block 120 can be moved in a second direction, which in the case illustrates is perpendicular to the first direction and along the length direction of the substrate, the present invention not being limited thereto. It will be clear for a person skilled in the art how to locate the second drive means in the sputter chamber 110 for providing a movement to the end block 120 which is transversal to the substrate or to the substrate movement direction. Therefore a means 150 for moving the end block 120 is provided. In embodiments of the present invention this means 150 for moving the end block is a rod 150 moving through the wall of the sputter chamber 110 and wherein the spacing between the wall of the sputter chamber 110 and the rod 150 is sealed by a second seal 140. In FIG. 3 the second seal 140 is a dynamic seal. The rod 150 might also be shielded in order to prevent material from being sputtered onto the rod. By means of this seal it is possible to maintain a vacuum within the sputter chamber 110 and an atmospheric pressure outside of the sputter chamber. The second direction in FIG. 3, i.e. the driven direction of movement of the end block 120 in the sputter chamber 110, is from left to right or vice versa. In alternative embodiments of the present invention, the second direction might be substantially perpendicular to the direction illustrated in FIG. 3. The exemplary embodiment according to the present invention illustrated in FIG. 3 allows to move the target 160 in a second direction in front of the substrate 170 in the length direction thereof, and in the meantime to rotate the cylindrical target 160. The substrate 170 is mounted in a substrate holder 180. The second direction, in the embodiment of the present invention, may be, but does not have to be, parallel with the substrate 170. In embodiments of the present invention a first seal 130 is present for sealing between the end block 120 and the first drive means 190 or between the end block 120 and the sealed box 195. In embodiments of the present invention this seal is a static seal. In embodiments of the present invention additional seals are present which enable to pass the cooling fluid towards the cylindrical target 160 and which permit the rotation of the cylindrical target 160 while maintaining the vacuum in the sputter chamber 110.

In embodiments of the present invention the length of a cylindrical target 160 may be between 500 and 3000 mm, preferably between 750 and 2200 mm The length of the cylindrical target 160 may be substantially equal to or longer than the width of the substrate 170 (measured in the first direction). Therefore the cylindrical target 160 is sputtering over the complete width of the substrate 170. By moving the cylindrical target 160 in the second direction also the complete length of the substrate 170 can be covered. Hereto, the cylindrical target 160 can be moved in length direction in front of a static substrate, or the cylindrical target 160 can be moved transversal to a moving substrate or transversal to the movement direction of a moving substrate, or the second movement applied to the cylindrical target 160 can be a combination of movement in the length direction and a movement transversal to the substrate or to the substrate movement direction. The thickness of the coating can be controlled through the electrical power applied on the cylindrical target 160 and/or by controlling the speed of the end block 120, and hence of the target 160, in the second direction. In embodiments of the present invention the power applied to the cylindrical target ranges between 1 kW and 100 kW preferably between 5 kW and 60 kW. In embodiments of the present invention the power level for a given target length may be varying between 4 kW/m and 30 kW/m. In embodiments of the present invention the speed of the target in the second direction may be between 2 mm/s and 400 mm/s.

In embodiments of the present invention the tubular target is powered by means of rotary connection. Compared to sputtering systems with a static planar target the present invention uses rotating cylindrical targets. Therefore, instead of a static electrical connection with the target, rotary connections are required to transfer the electrical power to the target. This can for example be realized by using brushes.

Figure 4:
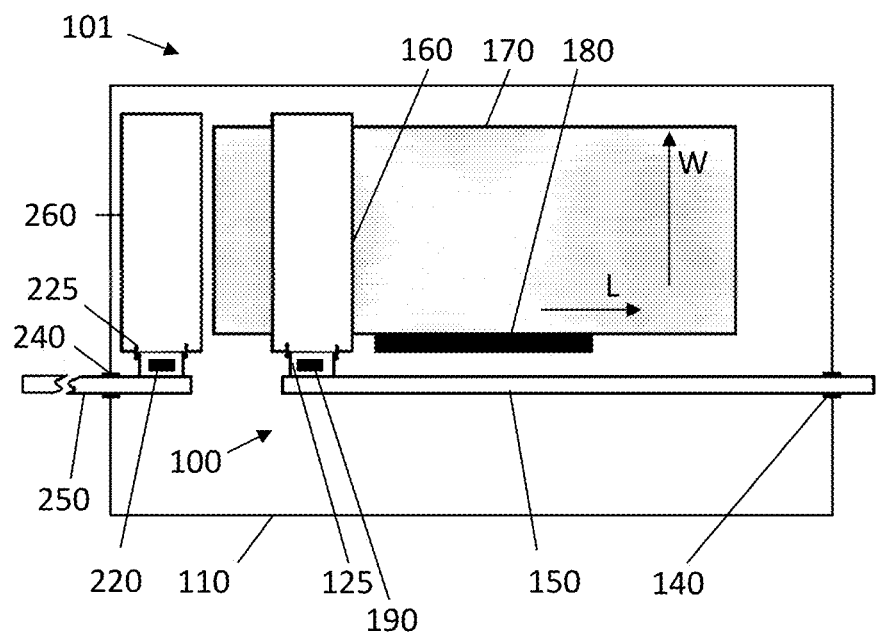
FIG. 4 shows a schematic diagram of a sputter device comprising two end blocks in accordance with yet other embodiments of the present invention.

In particular embodiments of the present invention the sputter device comprises a plurality of end blocks, for instance a first end block 120 and a second end block 220. A first cylindrical target 160 can be mounted on the first end block 120 and a second cylindrical target 260 can be mounted on the second end block 220. An example thereof has already been shown in and discussed with reference to FIG. 1 and FIG. 2, where a plurality of, for instance two, end blocks 120 are driven for simultaneous movement in the second direction, in the example illustrated, the present invention however not being limited thereto, along the length direction of the substrate. Another example thereof is shown in FIG. 4, where a plurality of, for instance two, end blocks 120 are driven for sequential movement in the second direction. Again, in the example illustrated in FIG. 4 the second direction is along the length of the substrate, but the present invention is not limited thereto, and the second direction could also be transversal to the substrate or to the substrate movement direction. In this case where a plurality of end blocks 12 are driven for sequential movement in the second direction, the material of the first cylindrical target 160 may be different from the material of the second cylindrical target 260. By alternatingly sputtering with the first respectively the second cylindrical target a coating comprising different materials can be sputtered on the substrate 170. In the example of FIG. 4 the substrate 170 is mounted on a substrate holder 180. The first seals, not visible in this figure, seal the first drive means against the end block. Second seals 140, 240 permit moving the first end block 120 and the second end block 220 in the second direction while maintaining a vacuum in the sputter chamber 110. Third seals 125, 225 permit rotating the cylindrical targets 160, 260 with the first drive means 190 while maintaining a vacuum in the sputter chamber 110. A means (e.g. a rod) 150 for moving the first end block 120 and a means 250 for moving the second end block 220 are also shown in FIG. 4.

In the exemplary embodiment of the present invention illustrated in FIG. 5 the sputter device 100 comprises a bellows 141 sealed against the wall of the sputter chamber 110, for allowing the at least one end block 120 to move without requiring presence of the means 150 for moving the at least one end block 120 inside the vacuum chamber 110. The means 150 for moving the at least one end block 120 can now be placed outside the vacuum chamber 110, which provides the advantage that no material will be sputtered onto it. The pressure in the bellows 141 is the atmospheric pressure. The first drive means 190 may be provided inside the bellows and therefore does not need to be encapsulated in a sealed box 195 as for instance in the embodiment illustrated in FIG. 1. The means 150 for moving the end block 120 in the second direction may also be provided inside the bellows 141. The bellows 141 permit moving the end block 120 from left to right and vice versa. The exemplary means 150 for moving the end block illustrated in FIG. 5 is a rod, the present invention, however, not being limited thereto, and it is driven by a second drive means 145 outside the sputter chamber 110. In embodiments of the present invention cooling tubes 113 and power cables 115 may be inserted in the rod as is illustrated in FIG. 5, or may be provided adjacent the rod 150 inside the bellows 141. Third seals 125 on the end block 120 permit to rotate the target 160 while keeping the vacuum in the sputter chamber 110. The embodiment illustrated in FIG. 5 is for moving the end block in a second direction along the length of a substantially static substrate, but in accordance with embodiments of the present invention, similar measures may be taken for moving the end block in a second direction substantially transversal to a moving substrate or to transversal to the moving substrate's movement direction.

Figure 6:
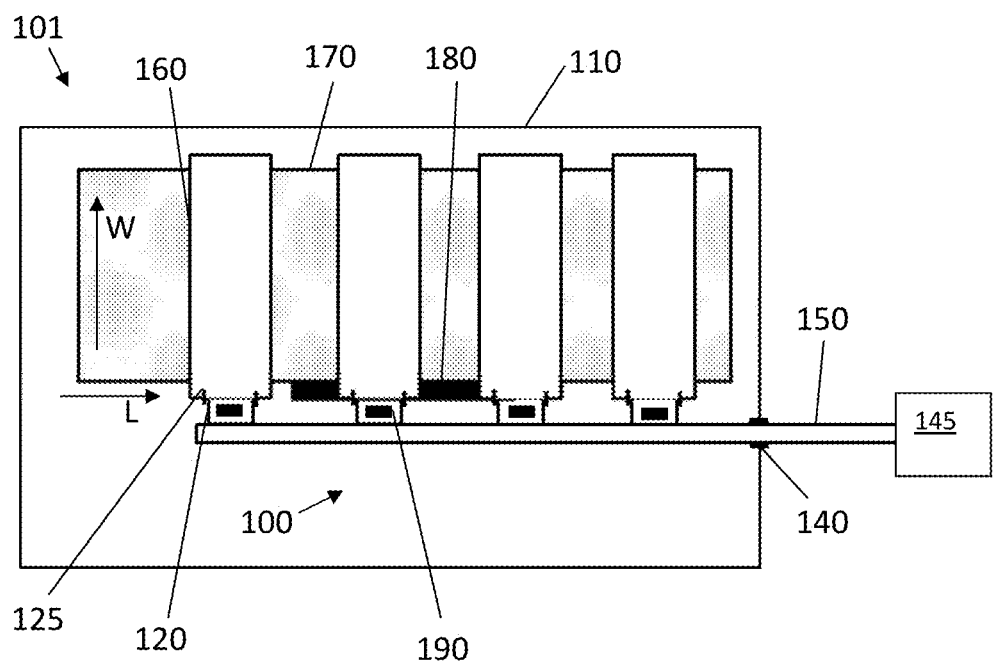
FIG. 6 shows a schematic diagram of a sputter device in accordance with embodiments of the present invention wherein a plurality of targets can be moved simultaneously in the second direction.

FIG. 6 illustrates a similar setup as in FIG. 3, except that in this embodiment of the present invention a plurality of end blocks 120, in the embodiment illustrated four end blocks 120, are mounted on the means 150 for moving the end blocks 120 in the second direction. In this embodiment, the second direction is along the length direction of the substrate. The end blocks 120 move simultaneously in the second direction when the means 150 for moving the end blocks 120 is correspondingly driven. A plurality of end blocks 120 could also be provided in a set-up similar to the one illustrated in FIG. 4, i.e. where multiple means 150, 250 are provided for moving end blocks 120, 220 in the second direction. In such embodiment, a first set of at least one end block could be driven to move in the second direction independently from the movement in the second direction of a second set of at least one end block. In particular embodiments, the second direction in which a first set of end blocks is driven, and the second direction in which a second set of end blocks is driven, do not even need to be same directions. For instance the second direction in which a first set of end blocks is driven could be along the length direction of the substrate, while the second direction in which a second set of end blocks is driven could be transversal to the substrate or to the substrate movement direction. The number of end blocks in the first set and the number of end blocks in the second set do not need to be equal.

Figure 7:
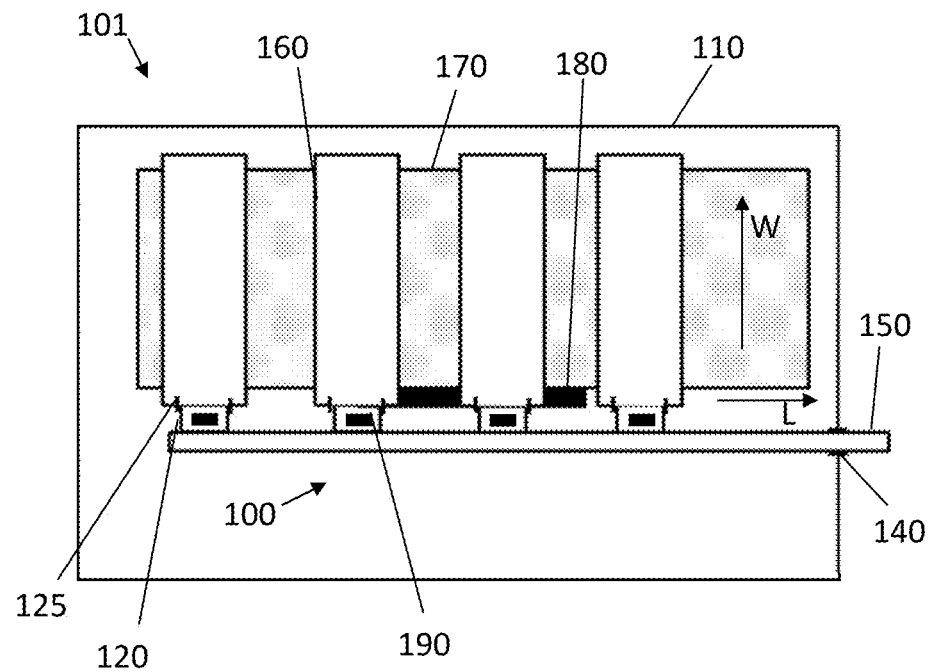
FIG. 7 shows the same diagram as in FIG. 6, but wherein the targets are positioned differently in accordance with embodiments of the present invention.

FIG. 7 shows the same embodiment as FIG. 6, but with end blocks 120 moved towards the left in the second direction. In embodiments of the present invention, the end blocks 120 can be moved much more to the left, for instance up till a position where all end blocks have moved beyond the left edge of the substrate 170 or of the array of substrates. A similar movement to the right is also possible. In alternative embodiments, the movement in the second direction, both to the left and to the right in the embodiment illustrated, is limited, such that substantially no overlap takes place between a first zone on the substrate or array of substrates sputtered by a first target and a second, neighbouring, zone on the substrate or array of substrates sputtered by a second, neighbouring, target. Such movement permits to cover the complete substrate 170 or array of substrates without moving the substrate or array of substrates itself. By using a plurality of targets the movement of the targets in the second direction may be reduced.

In embodiments of the present invention, both in embodiments for use with substantially fixed substrates and for use with moving substrates, the end block holds a magnet bar such that it is located substantially in the center of the cylindrical target 160, oriented in the first direction. In embodiments of the present invention the magnet bar is divided in different segments along the length of the cylindrical target 160 (first direction), each comprising separate magnet structures, and each of these segments can be orientated translationally and/or rotationally individually.

A translational change of the position of the magnet structures in the different magnet bar segments includes positioning of the magnet structures closer to or further away from the target surface. This allows the operator to control a property of the coating, for instance the thickness of the coating or an electrical or an optical property, along the third direction (width direction of the substrate) by orienting the segments of the magnet bar individually.

A rotational change of the orientation of the magnet bar around the central axis of the cylindrical target 160 induces orientation of the plasma in a certain direction. Thus the operator has an additional freedom to operate the sputter device 100 and influence the uniformity of the sputtered layer, for instance the thickness of the coating, in a direction on the substrate perpendicular to the third direction. This may be, but does not need to be, the fourth direction. Hereto, fourth drive means may be provided.

In embodiments of the present invention a third and fourth drive means is provided for driving the movement of the magnet bar, for translational and/or rotational movement, respectively. Using the third and/or fourth drive means it is possible to position at least one magnet structure of a plurality of magnet structures of a longitudinal magnet bar. The longitudinal magnet bar can be positioned in the center of a cylindrical target. The magnet structures are located along the length direction (first direction) of the longitudinal magnet bar. Thereby it is possible to influence the uniformity of the coating in the fourth direction of the substrate by independently controlling the position of the individual magnet structures of the magnet bar. The third drive means might for example move one or more of the magnet structures further away from the substrate or closer to the substrate. The fourth drive means might rotate one or more, for instance all, of the magnet structures around an axis parallel with the first direction. This rotation also has an impact on the uniformity, for instance the thickness, of the coating in the fourth direction.

The third and/or fourth drive means might comprise a positioning system for each of the magnet structures, individually and/or collectively. The third and/or fourth drive means might be controllable from outside the sputter chamber 110 such that the position of the magnet bar and/or magnet structures can be controlled during sputtering. This allows to control the uniformity, e.g. the thickness, of the sputtered coating in the fourth direction. If the third and fourth drive means are synchronized with the position of the end block in the second direction also the uniformity, e.g. the thickness, of the coating in the fourth direction can be influenced.

In embodiments of the present invention the first drive means 190 permits to rotate the cylindrical target 160, mounted onto an end block 120, around its longitudinal axis 161. This has as advantage that target utilization can be increased. The second drive means 145 permits to move the at least one end block 120 in the second direction, which, in embodiments of the present invention, allows to increase the uniformity of a property, for instance the thickness, of a coating provided onto a substrate 170 or array of substrates in the fourth direction. The uniformity of a property, for instance of the thickness, of the coating in the third direction can be controlled by the third drive means by moving the magnet structures as such adjusting their position (distance) with respect to the target surface along the magnet configuration in the first direction. By synchronizing the rotational movement of the magnet bar around the axis 161 of the cylindrical target 160, induced by the fourth drive means, with the translational movement of the end block 120 induced by the second drive means 145, the fourth drive means can also be used to control the uniformity, e.g. the thickness, of the coating in the fourth direction.

Figure 8:
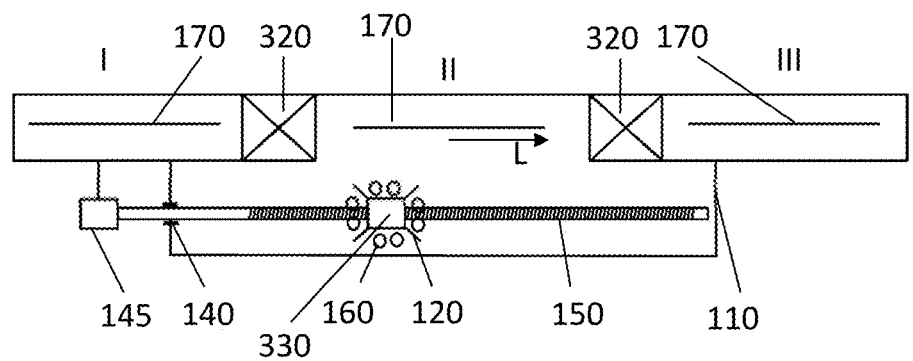
FIG. 8 shows a schematic diagram comprising a cathode assembly on which a plurality of end blocks can be mounted in accordance with embodiments of the present invention.

In embodiments of the present invention, as for instance illustrated in FIG. 8, a cathode assembly 330 can hold a plurality of end blocks 120. Each end block 120 can hold at least one target 160. Each end block 120 can be mounted on the cathode assembly 330 and on each end block a cylindrical target 160 can be mounted thus realizing a carrousel of cylindrical targets parallel with each other. In embodiments of the present invention each of these cylindrical targets are parallel with the substrate 170 or array of substrates. Each of these cylindrical targets can be rotated around its axis by a first drive means 190. The cathode assembly 330 can be rotated to orient one set of the targets, comprising one or more targets (preferably for instance 2 targets), towards the substrate 170. The cathode assembly 330 can be moved in a second direction by a means 150 for moving the end block 120 or in this embodiment the cathode assembly 330. This means is driven by a second drive means 145. The second direction may be, but does not need to be, perpendicular to the first direction. In the embodiment illustrated in FIG. 8, the second direction is along the length direction of the substrate. In alternatives to the embodiment illustrated in FIG. 8, not illustrated in the drawings, the cathode assembly can also be rotated to orient one set of targets towards the substrate, and the cathode assembly can be moved in a second direction which is for instance transversal to the substrate or to the substrate movement direction.

FIG. 8 shows schematically an exemplary embodiment of the present invention comprising a carrousel of cylindrical targets 160. The top part of the figure shows a substrate 170 (but the same configuration may be used for an array of smaller substrates brought together so as to form a larger surface to be coated, similar to a larger substrate), which during a sputter operation is substantially static. This substrate is illustrated in FIG. 8 placed in three different positions:

position I: before entering the sputter chamber 110 position II: in the sputter chamber 110 between two valves 320 position III: after leaving the sputter chamber 110.

In alternative configurations, not illustrated in the drawings, zone I before entering the sputter chamber 110 and zone III after leaving the sputter chamber 110 may be physically the same location.

In yet alternative configurations, not illustrated in the drawings, the substrate might be continuously moving within the sputter chamber, and the second direction might be transversal to the substrate surface or to the substrate movement direction.

A means 150 for moving the cathode assembly 330 comprising a plurality of end blocks 120 in FIG. 8 is driven by a drive means 145 outside the sputter chamber 110. In the embodiment of the present invention illustrated in FIG. 8 the means 150 for moving the cathode assembly 330 in the second direction is a threaded rod, the present invention not being limited thereto, and any suitable drive means forming embodiments of the present invention. A second seal 140, in this case a dynamic seal, between the threaded rod 150 and the wall of the sputter chamber 110 permits rotating the threaded rod 150 while maintaining a vacuum in the sputter chamber 110. The cathode assembly 330 can be rotated around its axis in order to position the preferred target or targets in front of the substrate 170. The at least one cylindrical target 160 positioned in front of the substrate 170 can be rotated around its axis 161 (not illustrated in FIG. 8) by a first drive means 190. Through the valves 320 the substrate 170 can enter or leave the sputter chamber 110. These valves 320 allow to create a vacuum in the sputter chamber 110. During operation, the cathode assembly 330, and hence the at least one cylindrical target 160 oriented towards the substrate 170, moves back and forward in the second direction within the sputter chamber 110, driven by the second drive means 145. This back and forward movement can for instance be along the length direction of a substantially static substrate, or transversal to a moving substrate or to its movement direction. Thereby the at least one cylindrical target 160 positioned in front of the substrate 170 is rotated around its axis, driven by the first drive means 190. When the desired property, for instance the desired thickness, of the sputtered material on the substrate is reached the cathode assembly 330 can be rotated to start sputtering another material. Hereto, the cathode assembly 330 may be driven in an opposite direction along the second direction in front of a substantially static substrate. This way of sputtering permits sputtering a coating consisting of a complex stack of different materials uniformly across a large 2D surface, for instance a large 2D substrate or an array of smaller 2D substrates, without the need for moving or transporting this substrate or array of substrates during the deposition process. In alternative embodiments, the moving substrate may be moved in opposite direction as during an earlier pass.

Figure 10:
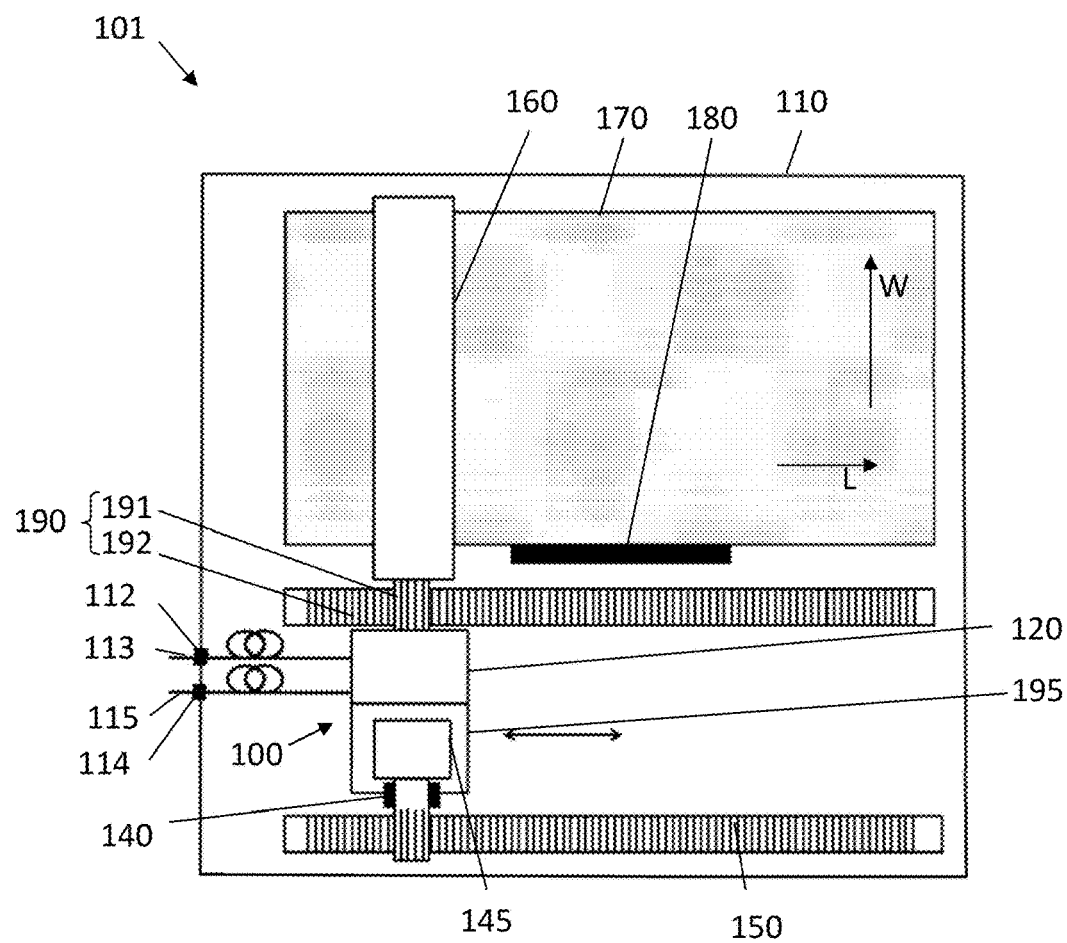
FIG. 10 shows a schematic diagram of a sputter device in accordance with yet other embodiments of the present invention.

In another exemplary embodiment of the present invention, illustrated in FIG. 10, the second drive means 145 is an electrical motor fixed to the end block 120. The second drive means is encapsulated by a sealed box 195. A seal 140 is provided, which is a seal between a shaft of the second drive means 145 and the sealed box 195. This seal 140 allows to have a pressure different from vacuum, for instance an atmospheric pressure, inside the sealed box 195, and a vacuum in the sputter chamber 110 while rotating the shaft of the second drive means 145. This shaft is a splined shaft capable of running over a means 150 for moving the end block 120 in the second direction, the means 150 being in the form of a toothed bar, of which the teeth and grooves matingly fit with the grooves and keys in the splined shaft. The toothed bar is oriented in the second direction. Instead of using a motor as first drive means 190, the axis 191 driving the rotation of the cylindrical target is in this embodiment of the present invention also splined and also runs over a second toothed bar 192. The end block 120 and the sealed box 195 are fixed to one another. By driving the end block 120 for movement in the second direction, by means of the second drive means 145, the cylindrical target 160 is thereby also forced to rotate. In the embodiment illustrated in FIG. 10, the second direction is along the length direction of the substrate, but in alternative embodiments, not illustrated in the drawings, similar means may be provided where the second direction is transversal to the substrate or to its movement direction.

Figure 13:
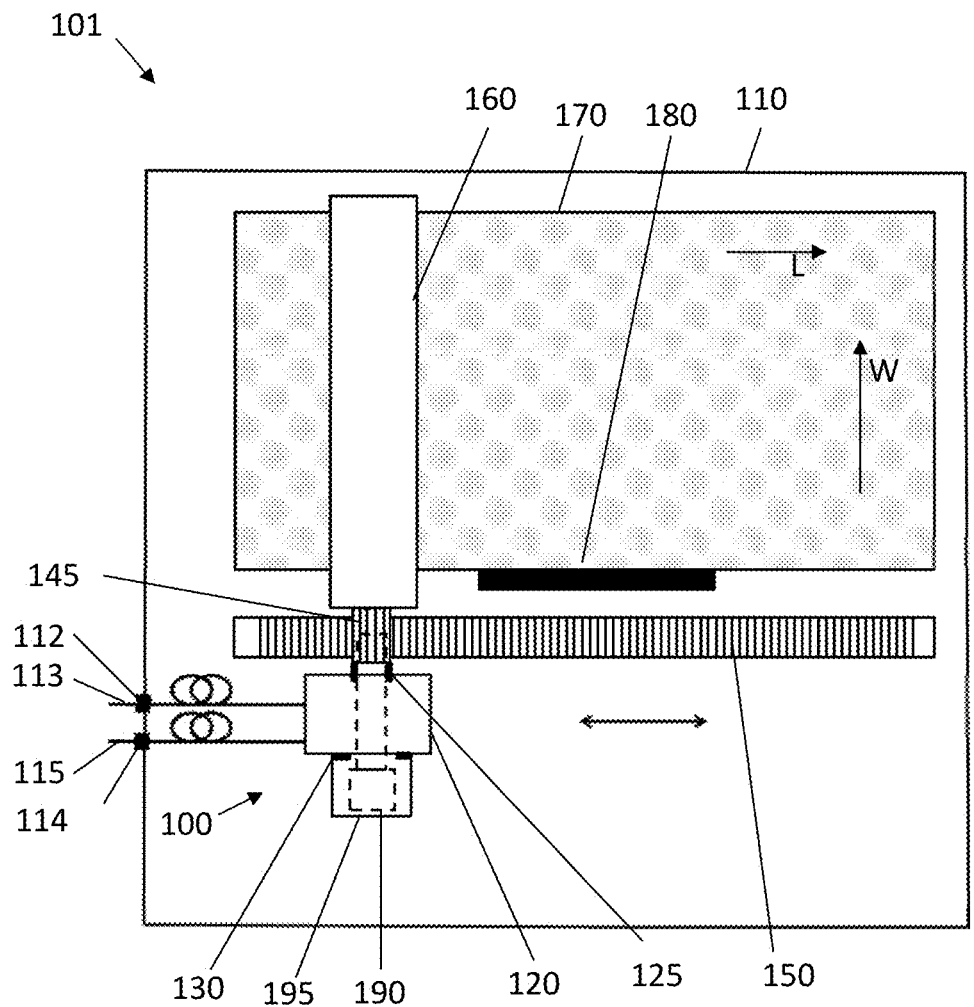
FIG. 13 shows a schematic diagram of a sputter device in accordance with embodiments of the present invention.

A similar but alternative embodiment is illustrated in FIG. 13. Again, this embodiment can be used with a substantially static substrate, as in the embodiment illustrated in FIG. 13. Alternatively, this embodiment can be adapted for use with a moving substrate, wherein the second direction is substantially transversal to the substrate or to the substrate movement direction. In these embodiments, a sealed box 195 is sealed against an end block 120 by means of seals 130. The first drive means 190 is an electrical motor inside the sealed box 195. Seals 125, between the end block 120 and the shaft of the first drive means 190, permit to rotate the cylindrical target 160 while maintaining a vacuum in the sputter chamber 110 and another pressure, for instance atmospheric pressure, in the sealed box 195. The second drive means 145 is enabled by having a splined shaft of the first drive means 190 running over a toothed bar 150 (the means for moving the end block 120 in the second direction). Rotation of the target 160 around its axis automatically induces movement of the end block in the second direction.

Particular embodiments of the present invention, for use with a substrate substantially moving in length direction of the substrate, are illustrated with reference to FIG. 14 and FIG. 15.

FIG. 14 shows a sequence of substrates 170 which are moved within a sputter chamber (not illustrated). In the sputter chamber, an end block 120 holding a cylindrical rotatable target 160 is provided. The target 160 has a longitudinal axis 161 in a first direction. A width direction W is defined on the substrate, which corresponds to a perpendicular projection of the first direction onto the substrate. The width direction of the substrate may or may not be parallel to the first direction. In the embodiment illustrated, the target 160 is vertically upstanding, and the width direction is a vertical direction. In alternative embodiments (not illustrated), the target could be placed under an angle with respect to the vertical direction, in which case also the width direction on the substrate could be defined different from the vertical direction. The substrates 170 illustrated move within a sputter chamber from left to right, as indicated by the large arrow pointing to the right. In the embodiment illustrated, each of the substrates 170 is slightly curved around an axis in the vertical direction. During sputtering, the target 160 is driven by a first drive means 190 providing a rotational movement of the target 160 around its longitudinal axis 161.

At the same time, a second drive meant 145 applies a movement to the end block 120 in a second direction. In the embodiment illustrated, the second direction is transversal to the substrate surface or to the substrate movement direction. The movement in the second direction may be such that the distance between the target 160 and the substrate 170 passing in front of it is constant. The second direction is defined in a movement plane, for instance in a horizontal plane. The second direction may or may not be perpendicular to the first direction. A length direction of the substrate may be defined as a direction along a dimension of the substrate, defined by an intersection of an intersection plane parallel to the movement plane as defined by the movement applied by the second drive means.

By keeping the distance between the target 160 and the substrate 170 constant, a layer property, for instance thickness or an electrical or optical property, of the deposited layer on the substrate along a substantial portion in the length direction, may deviate less than a predetermined layer property deviation margin.

Figure 15:
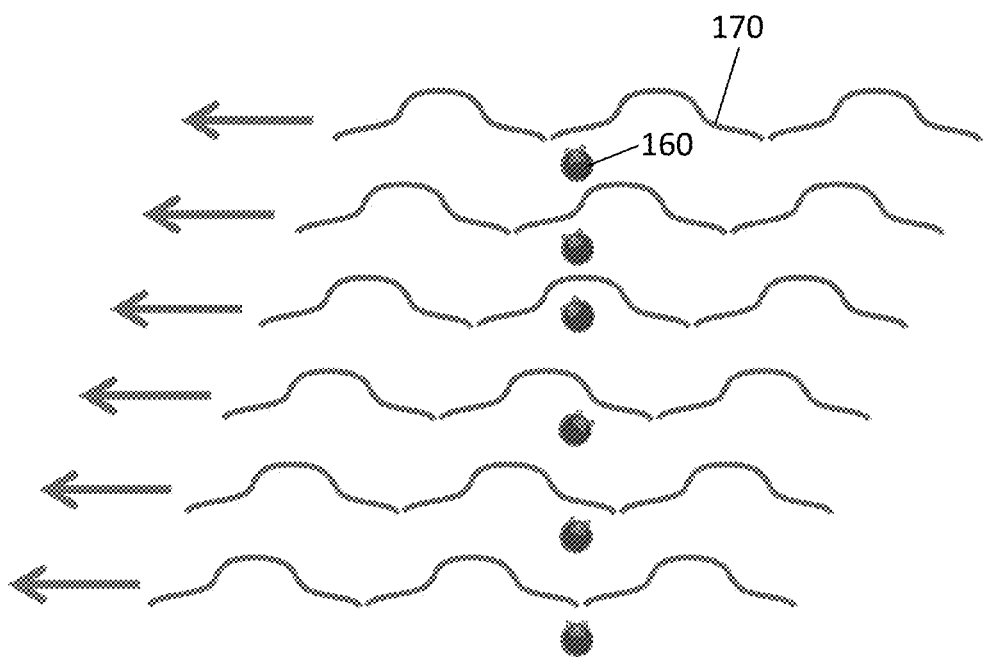
FIG. 15 illustrates an embodiment of the present invention with moving substrates, with the target illustrated in subsequent different positions.

FIG. 15 shows a top view of an implementation according to embodiments of the present invention, in which a plurality of substrates 170 are moved within a sputter chamber, in sequence. In the embodiment illustrated, the plurality of substrates 170 are moved within the sputter chamber from right to left, but the present invention is not limited thereto. In front of the substrates 170, an end block (not illustrated) for holding a cylindrical target 160 is provided. The cylindrical target 160 has a longitudinal axis in a first direction, which in the embodiment illustrated in top view is the direction which comes out of the plane of the drawing. First drive means (not illustrated in FIG. 15) are provided for providing rotational movement of the cylindrical target 160 around its longitudinal axis. Second drive means (not illustrated in FIG. 15) are provided for applying a movement to the end block 120 in a second direction, thereby keeping the target axis parallel during at least a significant portion of the movement trajectory along the second direction. The movement in the second direction, as illustrated in FIG. 15, is such that the distance between the substrate 170 and the target 160 is kept constant.

It can be appreciated that, due to the particular shape of the substrates 170 illustrated in FIG. 15, it is not sufficient to keep the distance between substrate and target constant. On top of the movement of the target 160 in a second direction transversal to the substrate or to the substrate movement direction, the magnetic system in the target 160 should be rotated along an axis in the first direction, such that the generated race track at the target surface is always under a controlled angle with respect to the substrate 170. This movement of the magnetic system may be realized by means of fourth drive means, applying a swinging movement of the magnetic system relative to the end block system or applying a rotational movement of the end block relative to the vacuum system.

By suitably driving the end block and/or the magnetic system as described above, a layer property of the deposited layer on the substrate along a substantial portion in the length direction of the substrate may deviate less than a predetermined layer property deviation margin, thus providing a sputtered layer with at least one uniform layer property, e.g. thickness and/or an electrical property and/or an optical property.

In particular embodiments of the present invention, not illustrated in the drawings, the target may be driven for rotation along its longitudinal axis, and may be simultaneously driven in a pivotal movement around the end block, such that the extremity of the target remote from the end block is moved towards or away from the substrate surface. This may be combined with a further statically positioned target (and hence end block) if the substrate is moving, or with a translational movement of the target along the length direction of the substrate if the substrate is statically positioned or with a translational movement of the target transversally to the substrate or to the substrate movement direction if the substrate is moved. Also the third movement of the magnet configuration, during which magnets are moved closer to or farther away from the target surface, and/or the fourth movement of the magnetic structure around an axis parallel to the first direction, may be implemented in such embodiments.

Figure 16:
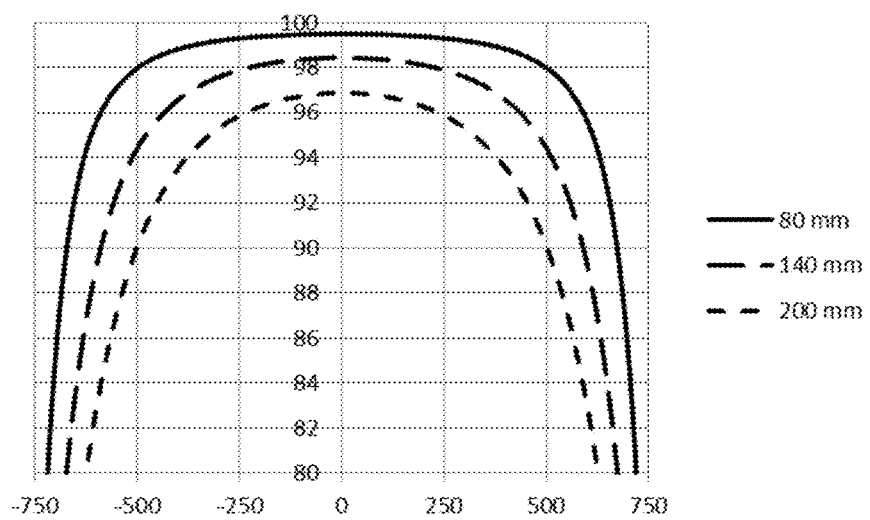
FIG. 16 and FIG. 17 illustrate absolute and relative values for a layer thickness measurement for particular configurations of target to substrate distance in a set-up as in FIG. 14.
Figure 17:
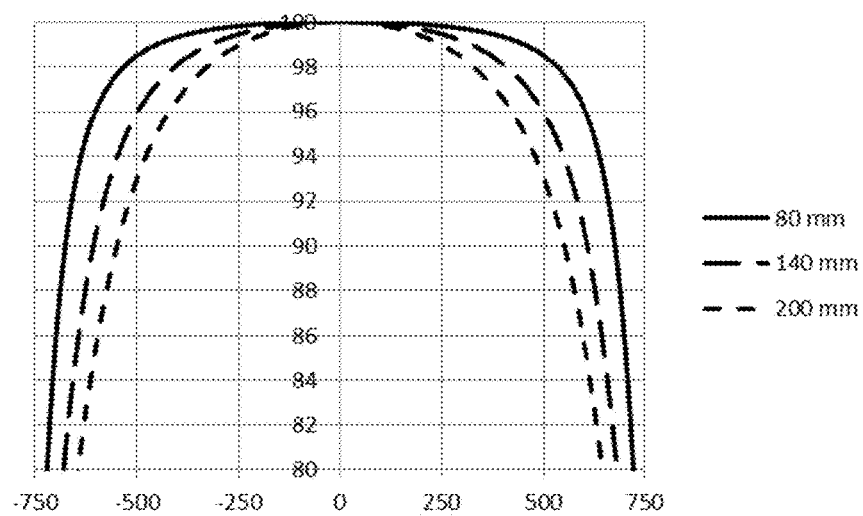

If the substrate has an irregular shape in the width direction, there is a difference in target to substrate distance over the width direction of the substrate. It can be shown that, if the distance between target and substrate becomes larger, there is more deviation on the uniformity of the sputtered layer at the level of the extremities of the target. This is illustrated in FIG. 16 and FIG. 17. The configuration which lies at the basis of these graphs is as follows: there is a vertical target configuration as in FIG. 14. The substrate width is 1000 mm (corresponding to the values from −500 mm to +500 mm in FIG. 16 and FIG. 17. The target length is 1560 mm (from −780 mm to +780 mm in FIG. 16 and FIG. 17) and represented by the horizontal axis.

FIG. 16 and FIG. 17 show absolute and relative results, respectively, for uniformity of a layer property of the deposited layer, for different substrate-target distances (distances being 80 mm, 140 mm and 200 mm, resp.) and represented in the vertical axis.

The absolute results of FIG. 16 illustrate the ratio in % of material arrival flux density (=deposition rate on the substrate) relative to the material departure flux density (=sputter rate from the target). FIG. 16 illustrates that increasing target to substrate distance allows more material flux "leaking away" and being deposited besides the substrate, which makes the uniformity of the layer sputtered at the level of the extremities of the target, being lower.

The relative results of FIG. 17 provide a relative deposition profile on the substrate along the target axis. It can be seen that for a target to substrate distance of 80 mm, the layer thickness at the bottom and top edge of the substrate is about 1.5% lower than in the center, while for a 140 mm target to substrate distance this is 4%, and for a 200 mm distance this is about 7%.

From the absolute results of FIG. 16, it can be seen that increasing the target to substrate spacing from 80 mm to 200 mm results in a reduction of the deposition rate in the center of the substrate with about 2.6% (from 99.5% to 96.9%). Providing a control algorithm on the sputter power depending on the target to substrate spacing may allow to compensate for this central thickness fluctuation for a curved substrate. After correction of the power signal, synced with the substrate movement and periodic with the substrate size and transport speed, results as the relative results illustrated in FIG. 17 may be achieved. This case still suffers from a variation in uniformity distribution on the substrate in a direction along the target length, originating from the varying target to substrate spacing. The latter constant variation of layer thickness over the surface of a curved substrate (worst uniformity for largest target to substrate spacing) may only be reduced by increasing the target length. This, however, would require the use of extra-long targets, giving a significant increase in variable costs (target material), a significant increase in investment costs (larger vacuum chambers) and a significant increase in energy consumption (more power for longer targets and more power for vacuum pumping and gas distribution).

A complete solution to all of these issues may be provided by implementing a sputter device in accordance with embodiments of the present invention, including at least the second drive means, and optionally also the third and/or fourth drive means.

Figure 9:
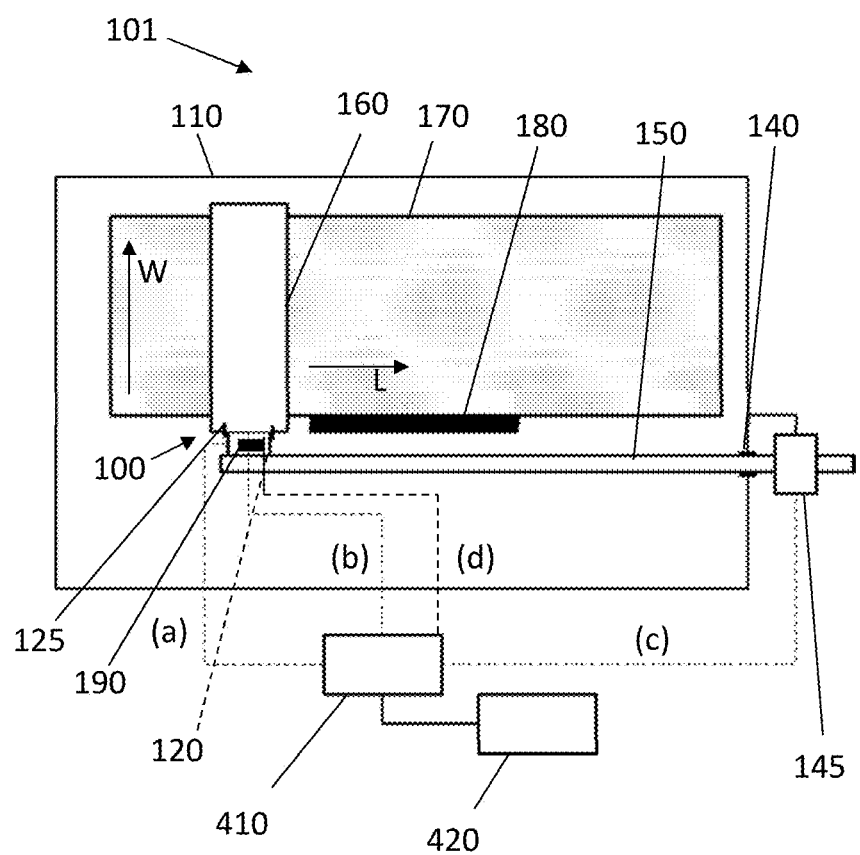
FIG. 9 shows a schematic diagram of a sputter device comprising a controller and computer for steering the sputter device in accordance with embodiments of the present invention.

The exemplary embodiment of the present invention schematically illustrated in FIG. 9 comprises a controller 410. The controller is illustrated in FIG. 9 only, but can be applied to any embodiments of the present invention. The dotted lines indicate the features which can be controlled in this embodiment:

(a) The rotation speed of the cylindrical target 160 by controlling the first drive means,
(b) The power applied to the cylindrical target 160 by controlling a power supply,
(c) The speed of the at least one end block 120 in the second direction by controlling the second drive means,
(d) Location dependent tuning of the magnet bar and/or magnet structures by controlling the third drive means for translational movement of magnet structures along the first direction and/or the fourth drive means for rotational movement of the magnet bar around a target axis.

The speed of the at least one end block 120 in the second direction can be controlled by controlling the second drive means 145 which is driving the rod 150 for moving the end block 120. The controller 410 can therefore control the speed in the second direction of the cylindrical target 160 in front of the substrate 170 or array of substrates which is mounted in the substrate holder 180. The rotational speed of the cylindrical target 160 can be controlled by controlling the first drive means 190 coupled to the end block 120. The position of the magnet structures along the first direction and/or the rotation of the magnet bar around a target axis can be controlled by the third and/or fourth drive means. In embodiments of the present invention the controller 410 can be operated through software running on a computer 420.

In embodiments of the present invention the controller 410 can also control other parameters such as the pressure within the vacuum chamber 110, location dependent gas distribution and flows. In embodiments of the present invention an additional drive means (not illustrated in the drawings) allows to increase or decrease the distance between the target and the substrate or array of substrates.

In embodiments of the present invention the controller 410 can be steered via a computer 420. A user interface on the computer 420 may allow an operator to control the sputtering process via the computer 420 and controller 410. Automation software on the computer 420 and/or on the controller 410 may automate the sputtering process. It might for example be possible that the speed of the end block 120 in the second direction and the power on the cylindrical target 160 are controlled automatically by the software to obtain a uniformity in a coating property, for instance thickness, which is specified by the operator. As an example, in embodiments of the present invention software on the computer 420 permits the operator to specify a stack of layers with a preferred property distribution, for instance a preferred thickness, for each layer. Based on these specifications the software on the computer determines the optimal parameters (e.g. parameters for controlling the first, second, third and fourth drive means, parameters for controlling the electrical power on the target) for controlling the sputter device 100.

In embodiments of the present invention a control loop for controlling the sputtered coating can be closed by measuring a property or multiple properties of the provided coating. This property can be coupled back to close the control loop. A possible property which may be measured is the thickness of the coating, another property could be the resistivity of the coating, optical properties might also be taken into account. These properties may be measured on several locations on the substrate or array of substrates and they may be measured in the first direction as well as in the second direction. Based on the measurement results, and determined deviations from desired values, control signals may be generated for adapting parameters of the sputter process, such as for instance the driving parameters of the first, second, third and fourth drive means, electrical power provided on the target, gas flow, . . .

Figure 18:
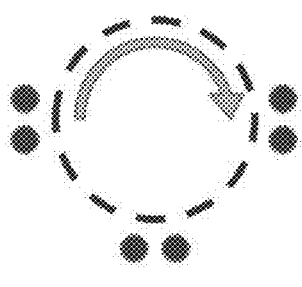
FIGS. 18a-18c illustrates different embodiments of a batch coater which can be used in accordance with embodiments of the present invention.
Figure 18:
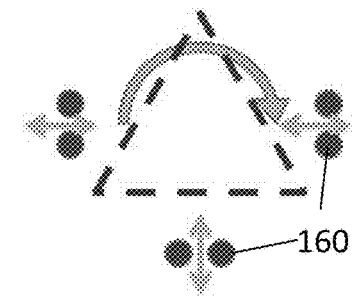
Figure 18:
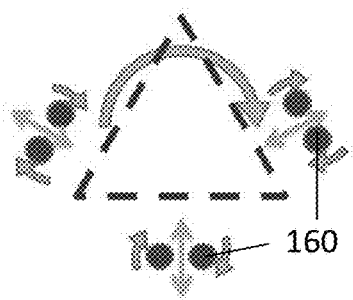

While prior art batch coaters have a circular drum covered with samples to be coated, as illustrated in FIG. 18(a), embodiments of the present invention allow to use drums which have another shape in cross-section, as for instance, but not limited thereto, a triangular shape as illustrated in FIG. 18(b) and FIG. 18(c). In accordance with embodiments of the present invention, the at least one target 160, held by an end block 120, may be driven in a second direction transversal to the substrate or substrates on the coater drum, as illustrated in FIG. 18(b). However, in view of the triangular shape of the drum, during rotation of the drum, the target to substrate distance would be different for different angular positions of the drum. In accordance with embodiments of the present invention, during rotation of the drum, the end blocks holding the targets can be moved in a second direction transversal to the substrates, and at the same time the end blocks and/or the magnetic configurations inside the targets can be rotated, by means of fourth drive means, so that the race track is under a controlled angle with respect to the substrate.

In a second aspect, embodiments of the present invention relate to a method for sputtering, in a vacuum chamber, large area surfaces having a length in a length direction and a width in a width direction, for instance large area substrates or arrays of smaller substrates together forming a large area surface. The method comprises the step of rotating a cylindrical target around its longitudinal axis which is oriented in a first direction. In embodiments of the present invention the first direction is parallel with a substrate. Simultaneously, the cylindrical target is moved in a second direction, thereby keeping the target axis parallel during at least a significant portion of the movement trajectory along the second direction. The movement in the second direction is such that a layer property of the deposited layer on the substrate along a curve on the substrate, defined by a projection of a sputter location of the target onto the substrate under the relative movement between target and substrate, deviates less than a predetermined layer property deviation margin. In embodiments of the present invention, the second direction may be along the length direction of the substrate. The second direction may have a component along the first direction. In alternative embodiments of the present invention, or combined therewith, the second direction may have a component transversal to the substrate surface or to the substrate movement direction. The second direction may be, but does not need to be, perpendicular to the first direction. The second direction may be defined in a movement plane, for instance, but not limited thereto, a horizontal plane. A length direction of the substrate may be defined as a direction along a dimension of the substrate, defined by an intersection of an intersection plane parallel to the movement plane as defined by the movement applied by the second drive means. The translational movement of the cylindrical target in the second direction is such that the longitudinal axis of the target does not change direction, i.e. remains parallel to itself in different positions in the second direction, along at least a significant portion of the movement trajectory along the second direction.

In embodiments of the present invention the method moreover comprises the translational movement of individual magnet structures and/or the rotational movement of a magnet bar around a target axis, or the rotational movement of an end block with respect to the vacuum chamber. The individual magnet structures are positioned along a longitudinal magnet configuration oriented in the first direction.

In embodiments of the present invention the method moreover comprises synchronizing the translational movement of the target along the second direction with the translational or rotational movement of a magnet configuration around a target axis. This synchronization of movements may take into account the shape of the substrate.

In embodiments of the present invention the method is applied to multiple targets. The embodiment of the present invention illustrated in FIG. 4 can for example be operated by first moving the first cylindrical target 160 in the second direction along the length of a substrate 170. This can be done once or repeated multiple times. Next the second cylindrical target 260 can be moved in the second direction along the length of the same 2D surface, consisting of a large substrate 170 or an array of smaller substrates. Also this can be done once or repeated multiple times. The process of alternatingly sputtering with the different targets 160, 260 can be continued until the coating on the 2D surface, e.g. substrate 170, has reached the desired parameter distribution, for instance the desired thickness and composition. Using this method a multilayer stack can be obtained with one process step, i.e. without breaking the vacuum. It is not required to replace a certain cylindrical target nor to move the 2D surface, e.g. substrate 170, from one sputter device to another sputter device. While moving one of the cylindrical targets in the second direction, that cylindrical target is also rotated around its axis.

The invention claimed is:

1. A sputter device for depositing a layer on a substrate in a vacuum chamber,
   the sputter device comprising:
   at least one end block adapted for each holding a cylindrical target and at least one magnet structure configured for generating a plasma, the target having a longitudinal axis in a first direction,
   a first drive means for providing rotational movement of the at least one cylindrical target around its longitudinal axis,
   a second drive means for applying a translational movement to the at least one end block in a second direction, thereby keeping the target axis parallel during at least a significant portion of the movement trajectory along the second direction, and
   wherein the first and the second drive means are adapted for, during sputtering, being operational simultaneously in the vacuum chamber, and wherein the second drive means is adapted for allowing a linear translational movement;
   wherein the cylindrical target is a cylindrical sputtering target.

2. A sputter device according to claim 1, for depositing a layer on a substrate having a length in a length direction and a width in a width direction, wherein the first direction is positioned along the width direction, and the second direction is along the length direction of the substrate.

3. A sputter device according to claim 1, wherein the second drive means is adapted for applying a movement to the at least one end block in the second direction over more than twice the length of an end block.

4. A sputter device according to claim 3, wherein the second drive means is adapted for applying a movement to the at least one end block in the second direction over substantially the whole length of the substrate.

5. A sputter device according to claim 1, wherein the second direction has a component transversal to the substrate surface or to a movement direction of the substrate.

6. A sputter device according to claim 1, wherein the second direction has a component along the first direction.

7. A sputter device according to claim 1, wherein the second direction is oriented perpendicular to the first direction.

8. A sputter device according to claim 1, wherein the second drive means is adapted for applying a movement to the at least one end block in the second direction such that the target axis is kept parallel over the complete movement in the second direction.

9. A sputter device according to claim 1, wherein the first drive means can operate in vacuum conditions or wherein the first drive means is provided inside a sealed box which can be moved together with the at least one end block by the second drive means.

10. A sputter device according to claim 1, the sputter device comprising a plurality of end blocks, at least a first end block adapted for holding at least one first cylindrical target and a second end block adapted for holding at least one second cylindrical target.

11. A sputter device according to claim 1, the sputter device comprising a third drive means for driving a longitudinal magnet configuration which can be placed in a cylindrical target, wherein the third drive means is adapted to define uniformity of the layer sputtered on the substrate in a direction corresponding to a perpendicular projection on the substrate of the first direction.

12. A sputter device according to claim 1, comprising a fourth drive means for rotating a longitudinal magnet configuration which can be placed in a cylindrical target, along an axis parallel to the first direction.

13. A sputter device according to claim 12, wherein the fourth drive means is adapted to sustain a controlled angle of sputter flux onto the surface of the substrate onto which the layer is to be deposited.

14. A sputter device according to claim 1, comprising a cathode assembly adapted for holding one or more end block(s), each adapted for mounting an cylindrical target, in an array configuration and wherein one or more particular cylindrical targets can be oriented towards a substrate and can be selected for being powered during sputtering.

15. A sputter device according to claim 1, the sputter device comprising a controller adapted for controlling
the speed of the at least one end block in the second direction and/or,
the power applied to the at least one cylindrical target and/or,
the rotation speed of the at least one cylindrical target and/or,
the position of a magnet bar within the at least one cylindrical target and/or,
the gas distribution along the at least one cylindrical target.

16. A sputter device according to claim 1, wherein the speed of the at least one end block along the second direction is constant.

17. A method for sputtering a substrate in a vacuum chamber, the method comprising the step of rotating a cylindrical target around its longitudinal axis oriented in a first direction, while moving the cylindrical target in a second direction, thereby keeping the target axis parallel during at least a significant portion of the movement trajectory along the second direction, wherein moving the cylindrical target in the second direction includes applying a linear translational movement to the cylindrical target;
the cylindrical target provided with at least one magnet structure configured for generating a plasma.

18. A method according to claim 17, wherein, in a first step, a set of at least one first cylindrical target is moved in a second direction of the sputter chamber and wherein, in a second step, a set of at least one second cylindrical target is moved in the second direction of the sputter chamber.

19. A controller for controlling movement of at least one cylindrical target in a vacuum chamber of a sputter device, the movement comprising a first component being a rotational movement around its longitudinal axis oriented in a first direction, and, simultaneously, a second component being a linear translational movement in a second direction, thereby keeping the target axis parallel during at least a significant portion of the movement trajectory along the second direction;
the controller further configured for controlling a movement of at least one magnet structure for forming a plasma.

* * * * *